(12) United States Patent
Varkony

(10) Patent No.: US 8,120,960 B2
(45) Date of Patent: Feb. 21, 2012

(54) METHOD AND APPARATUS FOR ACCESSING A NON-VOLATILE MEMORY ARRAY COMPRISING UNIDIRECTIONAL CURRENT FLOWING MULTIPLEXERS

(75) Inventor: Roni Varkony, Kfar Yona (IL)

(73) Assignee: Spansion Israel Ltd., Netanya (IL)

( * ) Notice: Subject to any disclaimer, the term of this patent is extended or adjusted under 35 U.S.C. 154(b) by 576 days.

(21) Appl. No.: 12/289,947

(22) Filed: Nov. 7, 2008

(65) Prior Publication Data

US 2009/0116288 A1 May 7, 2009

Related U.S. Application Data

(60) Provisional application No. 60/985,993, filed on Nov. 7, 2007, provisional application No. 60/985,994, filed on Nov. 7, 2007.

(51) Int. Cl.
*G11C 16/04* (2006.01)

(52) U.S. Cl. ......... 365/185.16; 365/185.23; 365/230.02; 365/230.06

(58) Field of Classification Search .............. 365/185.01, 365/185.13, 185.16, 185.17, 185.23, 230.02, 365/230.06, 185.16 O, 185.23 X, 230.02 X, 365/230.06 X See application file for complete search history.

(56) References Cited

U.S. PATENT DOCUMENTS

| | | | |
|---|---|---|---|
| 5,650,959 A | 7/1997 | Hayashi | |
| 6,130,452 A | 10/2000 | Lu | |
| 6,175,519 B1 | 1/2001 | Lu | |
| 6,532,173 B2 * | 3/2003 | Iioka et al. | 365/185.16 |
| 6,744,667 B2 * | 6/2004 | Yamamoto et al. | 365/185.16 |
| 6,768,165 B1 | 7/2004 | Eitan | |
| 6,967,896 B2 | 11/2005 | Eisen | |
| 6,975,536 B2 | 12/2005 | Maayan | |
| 6,992,932 B2 | 1/2006 | Cohen | |

OTHER PUBLICATIONS

"A Mathematical Theory of Communication" The Bell System Technical Journal, vol. 27, pp. 379-423, 623-656, Jul., Oct. 1948.

* cited by examiner

*Primary Examiner* — VanThu Nguyen

(74) *Attorney, Agent, or Firm* — Eitan Mehulal Law Group

(57) ABSTRACT

A non-volatile memory (NVM) having an array of memory cells and a unidirectional multiplexer (UMUX), the UMUX may be comprised of two or more address line ports adapted to receive addressing signals corresponding with elements in the memory array, and a set of switching transistors adapted to switch a supply voltage in accordance with the addressing signal such that current only flows into the array.

5 Claims, 18 Drawing Sheets

| 1. | IDEAL CURRENT SOURCE AS MEMORY DEVICE | FIGURES 8A-C | FIGURE 7 |
|---|---|---|---|
| | % OF bl LENGTH (MEMORY DEVICE POSITION) | DRAIN UMUX ON BOT, SOURCE UMUX ON TOP Vds [V] | STANDARD Y-MUX ON BOT VSOURCE [V] |
| | 10% | 3.805 | 3.961 |
| | 20% | 3.805 | 3.922 |
| | 30% | 3.805 | 3.883 |
| | 40% | 3.805 | 3.844 |
| | 50% | 3.805 | 3.805 |
| | 60% | 3.805 | 3.768 |
| | 70% | 3.805 | 3.727 |
| | 80% | 3.805 | 3.688 |
| | 90% | 3.805 | 3.649 |
| | 100% | 3.805 | 3.61 |
| 2. | IDEAL CURRENT SOURCE AS MEMORY DEVICE | FIGURES 9A-C | FIGURE 7 |
| | % OF bl LENGTH (MEMORY DEVICE POSITION) | DRAIN UMUX ON BOT, SOURCE UMUX ON TOP AND BOT Vds [V] | STANDARD Y-MUX ON BOT VSOURCE [V] |
| | 0 | 0 | 0 |
| | 10% | 17.55m | 19.5m |
| | 20% | 31.2m | 39m |
| | 30% | 40.95m | 58.5m |
| | 40% | 46.8m | 78m |
| | 50% | 48.75m | 97.5m |
| | 60% | 46.8m | 117m |
| | 70% | 40.95m | 136.5m |
| | 80% | 31.2m | 156m |
| | 90% | 17.55m | 175.5m |
| | 100% | 0 | 195m |

FIG.10C(i)

| 3. | REAL MEMORY DEVICE | FIGURES 8A-C | FIGURE 7 |
|---|---|---|---|
| | % OF bl LENGTH (MEMORY DEVICE POSITION) | DRAIN UMUX ON BOT, SOURCE UMUX ON TOP Vds [V] | STANDARD Y-MUX ON BOT VSOURCE [V] |
| | 10% | 3.954152712 | 3.990942101 |
| | 20% | 3.954228524 | 3.981858549 |
| | 30% | 3.9543045 | 3.972749687 |
| | 40% | 3.954380628 | 3.983815659 |
| | 50% | 3.954456908 | 3.954456664 |
| | 60% | 3.954533336 | 3.945272902 |
| | 70% | 3.95460991 | 3.936064576 |
| | 80% | 3.954686629 | 3.926831892 |
| | 90% | 3.954783491 | 3.917575058 |
| | 100% | 3.954840502 | 3.908294795 |

| 4. | REAL MEMORY DEVICE | FIGURES 9A-C | FIGURE 7 |
|---|---|---|---|
| | % OF bl LENGTH (MEMORY DEVICE POSITION) | DRAIN UMUX ON BOT, SOURCE UMUX UMUX ON TOP AND BOT VSOURCE [V] | STANDARD Y-MUX ON BOT VSOURCE [V] |
| | 0 | 0 | 0 |
| | 10% | 4.075418866m | 4.5289493734m |
| | 20% | 7.2520566235m | 9.0707250255m |
| | 30% | 9.5243099616m | 13.625155891m |
| | 40% | 10.888375905m | 18.192169352m |
| | 50% | 11.34213586m | 22.771666535m |
| | 60% | 10.885155289m | 27.363547246m |
| | 70% | 9.5186875813m | 31.967709966m |
| | 80% | 7.2456510725m | 36.584051846m |
| | 90% | 4.0706530277m | 41.212468703m |
| | 100% | 0 | 45.852600046m |

METHOD AND APPARATUS FOR ACCESSING A NON-VOLATILE MEMORY ARRAY COMPRISING UNIDIRECTIONAL CURRENT FLOWING MULTIPLEXERS

CROSS-REFERENCE(S) TO RELATED APPLICATION(S)

This application claims the benefit of U.S. Provisional Application No. 60/985,993, filed 7 Nov. 2007; and 60/985,994, filed 7 Nov. 2007; the disclosures of which are incorporated herein by reference in their entirety.

FIELD OF THE INVENTION

The present invention relates generally to the field of semiconductors. More specifically, the present invention relates to non-volatile memory (NVM) devices.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source (S), gate (G) and drain (D). In the FET a small amount of voltage is applied to the gate (G) in order to control current flowing between the source (S) and the drain (D). In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 schematically illustrates a FET 100 comprising a p-type substrate (or a p-well in the substrate), and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded, or it may be biased at a desired voltage, depending on applications.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors may be used, and are often paired with one another.

An integrated circuit (IC) device may comprise many millions of FETs on a single semiconductor "chip" (or "die"), measuring only a few centimeters on each side. Several IC chips may be formed simultaneously, on a single "wafer", using conventional semiconductor fabrication processes including deposition, doping, photolithography, and etching. After all the chips are formed, they can be singulated from the wafer.

The Floating Gate Transistor

A floating gate transistor is generally a transistor structure, broadly based on the FET, as described hereinabove. As schematically illustrated in FIG. 2, floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described herein below.

The floating gate is disposed over tunnel oxide (comparable to the gate oxide of the FET). The floating gate is a conductor; the tunnel oxide is an insulator (dielectric material). Another layer of oxide (interpoly oxide, also a dielectric material) separates the floating gate from the control gate. Since the floating gate is a conductor, and is surrounded by dielectric material, it can store a charge. Electrons can move around freely within the conductive material of the floating gate (which comports with the basic definition of a "conductor"). Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate, are described herein below.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described herein below.

Normally, a floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored (or trapped) in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around, as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 schematically illustrates a basic NROM memory cell, which may be viewed as an FET with an "ONO" structure inserted between the gate and the substrate. (One might say that the ONO structure is "substituted" for the gate oxide of the FET). The ONO structure is a stack (or "sandwich") of bottom (lower) oxide 322, a charge-trapping material such as nitride 324, and a top (upper) oxide 326. The ONO structure may have an overall thickness of approximately 10-25 nm, such as 18 nm, as follows:

the bottom oxide layer 322 may be from 3 to 6 nm, for example 4 nm thick;
the middle nitride layer 324 may be from 3 to 8 nm, for example 4 nm thick; and
the top oxide layer 326 may be from 5 to 15 nm, for example 10 nm thick.

The NROM memory cell has two spaced apart diffusions 314 and 316 (which can function as source and drain, as discussed herein below), and a channel region 320 defined in the substrate 312 between the two diffusion regions 314 and 316, and a gate 328 disposed above the ONO stack 321.

In FIG. 3, the diffusions are labeled "N+". This means that they are regions in the substrate that have been doped with an electron donor material, such as phosphorous or arsenic. These diffusions are typically created in a larger region which is a p-type cell well (CW) doped with boron (or indium or both). This is the normal "polarity" for an NVM cell employing electron injection (but which may also employ hole injection, such as for erase). With opposite polarity (boron or indium implants in an n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around; they will generally stay where they are stored. Nitride is a suitable charge-trapping material. Charge trapping materials other than nitride may also be suitable for use as the charge-trapping medium. One such material is silicon dioxide with buried polysilicon islands. A layer 324 of silicon dioxide with polysilicon islands would be sandwiched between the two layers of oxide 322 and 326. Alternatively, the charge-trapping layer 324 may be constructed by implanting an impurity, such as arsenic, into a layer of silicon dioxide deposited on top of the bottom oxide 322.

Memory cell 300 is generally capable of storing at least two bits of data—at least one bit(s) in a first storage area of nitride layer 324 represented by the dashed circle 323, and at least one bit(s) in a second storage area of the nitride layer 324 represented by the dashed circle 321. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack (nitride layer). The storage areas 321, 323 may variously be referred to as "charge storage areas", "charge trapping areas", and the like, throughout this document. (The two charge storage areas may also be referred to as the right and left "bits".) Each of the storage areas 321, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed so that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Modes of Operation

Generally, the modes of operation for any NVM memory cell (either floating gate, SONOS, TANOS, NROM or other) include "program", "erase" and "read". Modes of operation for NROM are now discussed.

Program generally involves injecting electrons into the charge storage areas of the NROM cell, typically by a process known as channel hot electron (CHE) injection.

Exemplary voltages to program (by CHE injection of electrons) the right bit (right bit storage area) of an NROM cell,
The left BL (acting as source, Vs) is set to 0 volts
the right BL (acting as drain, Vd) is set to +5 volts
the gate (Vg) is set to +8-10 volts
the substrate (Vb) is set to 0 volts
and the bit storage area above the drain (right BL) becomes programmed. To program the left bit storage area, source and drain are reversed—the left bitline serves as the drain, and the right bitline serves as the source.

Erase may involve injecting holes into the charge storage areas of the NROM cell, typically by a process known as hot hole injection (HHI). Generally, holes cancel out electrons (they are electrically opposite), on a one-to-one basis. Exemplary voltages to erase (by HHI injection of holes) the right bit of the NROM cell,
the left BL (acting as source, Vs) is set to float
the right BL (acting as drain, Vd) is set to +5 volts
the gate (Vg) is set to −7 volts
the substrate (Vb) is set to 0 volts
and the bit storage area above the drain (right BL) becomes erased. To erase the left bit storage area, source and drain are reversed—the left bitline serves as the drain and the right bitline serves as the source.

Read may involve applying voltages to the terminals of the memory cell and, based on subsequent current flow, ascertaining the threshold voltage of the charge storage area within the cell. Generally, to read the right bit of the NROM cell, using "reverse read",
the right BL (acting as source, Vs) is set to 0 volts
the left BL (acting as drain, Vd) is set to +2 volts
the gate (Vg) is set to +5 volts
the substrate (Vb) is set to 0 volts
and the bit storage area above the source (right BL) can be read. To read the left bit storage area, source and drain are reversed—the left bitline serves as the source, and the right bitline serves as the drain.

"Reading" an NROM Cell, Generally

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction, and reading is performed in what is termed the opposite or reverse direction. For example, to program the right storage area 323 (in other words, to program the right "bit"), electrons generally flow from left (source) to right (drain). To read the right storage area 323 (in other words, to read the right "bit"), voltages are applied to cause electrons to flow from right to left, in the opposite or reverse direction. For example, generally, to program the left storage area 321 (in other words, to program the left "bit"), electrons flow from right (source) to left (drain). To read the left storage area 321 (in other words, to read the left "bit"), voltages are applied to cause electrons to flow from left to right, in the opposite or reverse direction. See, for example, U.S. Pat. No. 6,768,165.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom). As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4A schematically illustrates an array of NROM memory cells (labeled "a" through "i") connected to a number of word lines (WL) and bit lines (BL). For example, the memory cell "e" has its gate connected to WL (n), its source (left hand diffusion) is connected to BL (n), and its drain (right hand diffusion) is connected to BL (n+1). The nine memory cells illustrated in FIG. 4A are exemplary of many millions of memory cells that may be resident on a single chip.

Notice, for example, that the gates of the memory cells "e" and "f" (to the right of "e") are both connected to the same word line WL (n). (The gate of the memory cell "d" to the left of "e" is also connected to the same word line WL (n).) Notice also that the right hand terminal (diffusion) of memory cell "e" is connected to the same bit line BL (n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

Operating Flash Memory

Flash is a non-volatile memory that can retain the data stored therein even after power is removed. NAND Flash, which is one type of Flash, is high-density design and has certain advantages over other types of memory, including a large storage capacity (such as one giga-bits or more), good speed for continued access, and low cost. However, NAND Flash also has several inherent drawbacks, including poor performance for random access and increased susceptibility to bit errors over the NAND Flash's operating lifetime. In particular, NAND Flash is typically accessed in units of pages, one page at a time, with each page being of a particular size (for example, 512 bytes).

Because the structure of NAND Flash is not suitable for random access, program codes cannot be executed directly from the NAND Flash. Instead, Static Random Access Memory (SRAM) or NOR Flash may be used as an intermediate storage for data and program codes that need to be accessed in a random manner by the processor. A memory architecture that incorporates both SRAM and NAND Flash or NOR and NAND Flash (with or without SRAM) may thus provide large storage capacity, reduced cost, and random access.

Conventionally, reading data from or writing data into NAND Flash requires excessive involvement and control by the processor. This can tie up the processor and prevent it from performing other functions, which can then result in overall performance degradation for the communication device. Moreover, since NAND Flash is more prone to bit errors, a mechanism is needed to ensure data integrity when loading data from or into the NAND Flash. As described in U.S. Pat. No. 6,967,896, a user wishing to write data to an NVM array may typically write the data to a cache memory, such as but not limited to, a static random access memory (SRAM). The cache memory routes or "addresses" the data to the appropriate bits in the NVM array. The data may be written to the SRAM in a byte granularity.

In a manner similar to NVM, SRAM may also be arranged in an array—for example, an N×n array of 1-bit cells, where:
n=byte width (such as 8, 16, 32 . . . )
N=number of bytes Generally, m address bits may be divided into x row bits and y column bits (x+y=m). Address bits may be encoded such that $2^m=N$ and the array may be organized with both vertical and horizontal stacks of bytes.

An example of a typical SRAM addressing scheme is shown in the following table.

| Rows | Columns | | | |
|---|---|---|---|---|
| | C0 | C1 | C2 | C3 |
| R0 | Address = 0<br>Data = x0 | Address = 1<br>Data = x1 | Address = 2<br>Data = x2 | Address = 3<br>Data = x3 |
| R1 | Address = 4<br>Data = x4 | Address = 5<br>Data = x5 | Address = 6<br>Data = x6 | Address = 7<br>Data = x7 |
| R2 | Address = 8<br>Data = x8 | Address = 9<br>Data = x9 | Address = 10<br>Data = x10 | Address = 11<br>Data = x11 |
| R3 | Address = 12<br>Data = x12 | Address = 13<br>Data = x13 | Address = 14<br>Data = x14 | Address = 15<br>Data = x15 |

FIG. 4B schematically illustrates, in a general manner, the concept that data is "buffered" in cache memory (such as SRAM) prior to being written to an NVM array (such as the NROM array shown in FIG. 4A) and when being read from the NVM array. The data may be in the form of a data stream which is accumulated by the SRAM into blocks, prior to writing to the NVM array. The SRAM may also serialize chunks of data which are read from the NVM array. The cache memory may be on the same chip as the NVM array.

More on Reading The State Of The Memory Cells

A memory cell may be programmed to different states, or program levels, determined by a threshold voltage (Vt) of the cell. For a single level cell (SLC), there are two program levels, generally "erase" and "program". For a multi-level cell (MLC) there are more than two program levels. An NVM cell's state may be defined and determined by its threshold voltage (Vt), the voltage at which the cell begins to conduct current. An NVM cell's threshold voltage level is usually correlated to the amount of charge stored in a charge storage region of the cell. Different threshold voltage ranges are associated with different states or program levels of an NVM cell.

Generally, in order to determine the state (program level) of an NVM cell, the cell's threshold level may be compared to that of a reference structure or cell whose threshold level is set, or otherwise known to be, at a voltage level associated with the specific state being tested for. Comparing the threshold voltage of an NVM cell to that of a reference cell is often accomplished using a sense amplifier or similar circuit. Various techniques for comparing an NVM cell's threshold voltage against those of one or more reference cells or structures, in order to determine the NVM cell's state, are well known.

When reading a NVM cell, to determine whether it is at a particular state, the cell's threshold voltage may be compared against that of a reference cell having a reference threshold voltage defined as a "read" level for the specific state. A "read" level is usually set lower than a program verify (PV) level and higher than an erase verify (EV) level in order to compensate for voltage drifts which may occur during operation.

In a "binary" or single level cell (SLC) capable of storing only one bit of information (a logic 1 or a logic 0), only a single read verify (RV) voltage is required, and it may be between the erase verify (EV) and program verify (PV) voltages for the cell. "Read" is generally done by measuring the Vt of a cell (or half-cell), and associating the measured Vt with a program level (such as "0" or "1"). Although the Vt's of the cells are measured on an individual basis, it is generally necessary to determine a distribution of Vt's for many cells in order to associate the measured Vt of a given cell with a program level, with confidence. For example—if only one cell were to be read, and its threshold voltage were to be found to be at or very near a Read Verify (RV) voltage between two program levels, it may be difficult to say, with certainty, at which of two program levels the single cell was programmed, since its threshold voltage may have moved slightly upward or slightly downward since it was programmed. This is a benefit of reading bits one block at a time—to obtain a statistically meaningful sample of Vt's across a number of cells.

FIG. 5A is a graph schematically illustrating two states of a "binary" or single level cell (SLC) capable of storing one bit of information per cell (or per charge trapping area with an NROM cell), and utilizes only one read verify threshold (RV). Generally, the two states are erased (represented by "1") and programmed (represented by "0"). The horizontal axis is threshold voltage (Vt), increasing from left to right. Three voltage levels are illustrated in FIG. 5A, these are EV (erase verify), RV (read verify) and PV (program verify). As illustrated, EV is less than RV, which is less than PV. A high Vt may represent a program state of binary "0", and a low Vt may represent an erase state of binary "1". The binary designations are arbitrary, and may be reversed (high Vt="1", low Vt="0").

FIG. 5A is generalized, and is applicable to a typical floating gate NVM memory cell or a given charge storage area of an NROM cell. The curves represent the threshold voltages (Vts) for a number of cells at the given program level. Typically, there is a distribution, or spread, about a nominal (or average, or center) value. For example, the center value for "1" equals approximately 3.5 volts
the center value for "0" equals approximately 6.0 volts
EV equals approximately 4.0 volts
RV equals approximately 4.5 volts
PV equals approximately 5.5 volts FIG. 5B schematically illustrates a situation wherein there are four possible MLC program levels (or states) 11, 01, 00, 10 for each memory cell (or, in the case of NROM, for each storage area of the memory cell). As illustrated, the program level 11 has the lowest Vt, the program level 01 has a higher Vt, the program level 00 has a yet higher Vt, and the program level 10 has a yet higher Vt. The program level 11 may be erase (ERS), which for purposes of this discussion is considered to be a program level, although it is not generally regarded as such.

There are a number of memory cells (or storage area NROM cells) being programmed, erased and read. In a given array, or on a given memory chip, there may be many millions of memory cells. Programming may typically be performed in blocks of thousands of memory cells. The different blocks of memory cells are typically located at different logical positions within the array, and at different physical positions on the chip. During (or before) programming, a check sum indicative of the number of cells programmed to each level may be stored in the block, in the array, on the chip, or external to the chip.

At each program level (and this is also true for the SLC cell of FIG. 5A), there is typically a distribution of threshold voltages within a range (a statistical spread). In other words, for a given program level, the threshold voltage is not likely to be exactly a unique, precise voltage for all of the memory cells being programmed to that level. Initially, in the act of programming the cell, the voltage may be off a bit, for example, as a result of the state of neighboring cells (or the other charge storage area in the same NROM cell), or, as a result of previous program or erase operations on the same cell, or neighboring cells, or, as a result of a variety of other factors. After programming, the threshold voltage of a cell may change, as a result of programming neighboring cells (or the other charge storage area in the same NROM cell), or a variety of other factors.

Therefore, the threshold voltage (Vt) for a given program level may be more than average in some cells, in others it may be less than average. Nevertheless, in a properly functioning group of cells (such as a block, or an array), there should be a clear distribution of four distinct program levels, such as illustrated. The distributions of Vt for each of the program levels should be separated enough from one another so that read positions (RV voltage levels) can be established between adjacent distributions of threshold voltages, such as the following:

RV01 is between EV and PV01, or higher than the highest expected Vt for a cell at state "11" and lower than the lowest expected Vt for a cell at state "01";

RV00 is between PV01 and PV00, or higher than the highest expected Vt for a cell at state "01" and lower than the lowest expected Vt for a cell at state "00"; and RV 10 is between PV00 and PV10, or higher than the highest expected Vt for a cell at state "00" and lower than the lowest expected Vt for a cell at state "10".

For example,
- the center value for "11" equals approximately 4.0 volts
- the center value for "01" equals approximately 4.4 volts
- the center value for "00" equals approximately 4.8 volts
- the center value for "10" equals approximately 5.4 volts
- EV equals approximately 4.0 volts
- RV01 equals approximately 4.4 volts
- PV01 equals approximately 4.8 volts
- RV00 equals approximately 5.4 volts
- PV00 equals approximately 5.6 volts
- RV10 equals approximately 6.0 volts
- PV10 equals approximately 6.3 volts An Aside About Binary Notation, and the Labeling of Program Levels "Binary" generally means "two". In binary notation, there are only two possible digits, usually referred to as "1" and "0". Many 1s and 0s can be strung together to represent larger numbers, for example:
- 0000 is zero
- 0001 is one
- 0010 is two
- 0011 is three
- 0100 is four
- 1000 is eight
- 1010 is ten In the examples above, the binary numbers have four digits each—four "places". For purposes of this disclosure, only two digits will be used. Two digits can represent four numbers. Counting (in binary) typically starts with zero, and counting from zero to three proceeds like this: 00 (zero), 01 (one), 10 (two), 11 (three). Notice, in the transition from 01 (one) to 10 (two), both bits change.

Since it is arbitrary which program levels represent which digits, notice in FIG. 5B that the program levels appear to be out of sequence, starting with 11 (three), then 01 (one), then 00 (zero), then 10 (two). This sequence is common, so that when moving from one program level to the next higher level, both bits do not change—as is the case with the transition from 01 (one) to 10 (two). In FIG. 5B it can be seen that when moving from one program level to another, only one of the bits changes.

SUMMARY OF THE INVENTION

The present invention is a method and circuit for accessing a non-volatile memory (NVM) array, which memory array may be part of a non-volatile memory device.

According to some embodiments of the present invention, there is provided a unidirectional array access multiplexer (UMUX) adapted to direct or otherwise connect a supply voltage to one or more array segments such as, for example, one or more cell columns.

According to some embodiments of the present invention, the UMUX may include one or more address line ports (address ports) and a set of switching transistors. The UMUX may direct or otherwise connect an external voltage source (e.g. voltage source regulator Vsr) to an array segment in accordance with an addressing signal applied to the one or more address ports.

According to some embodiments of the present invention, at least a portion of the array segment to which UMUX may provide a connection may be a global bit-line of the array associated with an NVM cell or cells designated by the addressing signal applied to the UMUX.

According to some embodiments of the present invention, the UMUX may include switching transistors adapted to connect the supply voltage to the array, and to carry an operating current into the array. Operating current leaving the array may be connected to a voltage drain (e.g. Vdr) such as, for example one or more sense amplifiers through a second multiplexer. Optionally, Vd may comprise a drain regulator, or other circuitry adapted to act as Vd as may be known by a person skilled in the art. The operating current may comprise, in some embodiments of the invention, a sensing current, a programming current, a test current, or any other type of current according to the circuitry adapted to act as Vd.

In some embodiments of the invention, the NVM array comprises NVM cells arranged in M rows and N columns, the cells in a column interconnected such that a source electrode in each cell is connected to a local source bit line (LSBL), and the drain electrode of each cell is connected to a local drain bit line (LDBL). One or more LSBL may be connected to a global source bit line (GSBL), the GSBL adapted to carry current to the one or more LSBL, responsive to UMUX switching. One or more LDBL may be connected to a global drain bit line (GDBL), the GDBL adapted to carry a sensing current from the one or more local drain bit lines to a second UMUX. The second UMUX, which may include one or more address ports and a set of switching transistors, responsive to substantially simultaneously receiving addressing signals (synchronization) with the first UMUX, is adapted to connect the GDBL to one or more sense amplifiers.

A select switch, which may comprise one or more transistors, may optionally be placed at a junction of the LSBL and GSBL, and/or LDBL and GDBL. The select switch, responsive to a control signal received from the first and/or, optionally, the second UMUX, is adapted to select between a pluralities of local bit lines connected to a global bit line.

In some embodiments of the invention, the circuit may be configured such that the first UMUX is connected to one or more sense amplifiers while the second UMUX is connected to the external voltage source Vsr. In this optional configuration, the source and the drain are interchanged; that is, LSBL is connected to the drain electrode of the cells in a column and LDBL is connected to the source electrode of the cells in the column. Optionally, LDBL is connected to GSBL and LSBL is connected to GDBL. Optionally, the first U-MUX may be connected to other voltage regulators in a program or erase mode.

In the above described embodiments, the inventors have determined that an essentially equal drain-source voltage (Vds) may be achieved across all memory cells (elements) in the array by maintaining an IR drop (voltage drops due to bit line resistance) between Vsr and Vdr substantially the same for essentially all the cells in the array. As a distance from Vsr increases along GSBL (and the IR drop along GSBL increases), a distance to Vdr decreases along GDBL (and the IR drop along GDBL decreases) compensating for the IR drop in GDBL, and resulting in the constant Vds in each cell.

In some embodiments of the invention, the second multiplexer may be a multiplexer (Y-MUX) adapted to connect to both Vsr and to one or more sense amplifiers. Optionally, the Y-MUX may be adapted to connect to both Vsr and to one or more voltage regulators in a program or erase mode. In this configuration, one or more switching transistors in the Y-MUX may be connected to Vsr and to GSBL, allowing current flow from Vsr into GSBL from both first UMUX and from MUX when UMUX and Y-MUX are in synchronization. Additionally, one or more switching transistors in Y-MUX are connected to GDBL and to the sense amplifiers, allowing sensing current flow from GDBL to the sense amplifiers.

In the above described embodiment comprising the UMUX connected to one side of the array and the Y-MUX connected to the other side of the array, the inventors have determined that a reduction in the resistance of GSBL by up to a factor of 4 may be achieved. By connecting GSBL to Vsr at both ends a worst case bit line resistance is at the middle of the bit line, and comprises a parallel connection of two half bit lines. Furthermore, if geometry of the array provides more directions of connecting GSBL, the bit line resistance may be reduced by a factor of $x^2$ (where $x^2$ is the number of connecting directions). By reducing the bit line resistance a smaller source voltage develops at the source electrode of the memory cell, and substantially improving read and program operations in the cell.

In some embodiments of the invention, the circuit, the NVM array, and/or NVM device, may be comprised in apparatus used in communication systems, medical systems, transportation systems, computer systems, consumer electronic systems, power transmission systems, and the like. Some of this apparatus may include, for example; desktop computers and workstation, portable computers, mobile telephones, avionics, and medical imaging equipment, among others.

There is provided, in accordance with an embodiment of the invention, a non-volatile memory (NVM) memory device comprising an array of memory cells; and a unidirectional multiplexer (UMUX), the UMUX comprising two or more address line ports adapted to receive addressing signals corresponding with elements in the memory array, and a set of switching transistors adapted to switch a supply voltage in accordance with the addressing signal such that current only flows into the array. Optionally, the elements comprise at least one global source bit line (GSBL) adapted to carry the current flowing into the array. Optionally, the GSBL is connected to at least one local source bit line (LSBL).

In some embodiments of the invention, the NVM device further comprises a second UMUX, the second UMUX comprising two or more address line ports adapted to receive addressing signals corresponding with elements in the memory array, and a set of switching transistors adapted to switch an operating current in accordance with the addressing signal such that current flows out of the array. Optionally, the elements comprise at least one global drain bit line (GDBL) adapted to carry the operating current flowing out of the array. Optionally, the GDBL is connected to at least one local drain bit line (LDBL). Additionally or alternatively, the second UMUX is interchangeable with the first UMUX.

In some embodiments of the invention, the NVM device further comprises a multiplexer (Y-MUX), the Y-MUX comprising two or more address line ports adapted to receive addressing signals corresponding with the elements in the memory array, a set of switching transistors adapted to switch a supply voltage in accordance with the addressing signal such that current flows into the array, and a set of switching transistors adapted to switch an operating current in accordance with the addressing signal such that current flows out of the array. Optionally, the elements comprise at least one global source bit line (GSBL) adapted to carry the current flowing into the array, and at least one global drain bit line (GDBL) adapted to carry the operating current flowing out of the array. Optionally, the GSBL is connected to at least one local source bit line (LSBL) and the GDBL is connected to at least one local drain bit line (LSDL).

There is provided, in accordance with an embodiment of the invention, a unidirectional multiplexer (UMUX) for a non-volatile memory (NVM) array, the UMUX comprising two or more address line ports adapted to receive addressing signals corresponding with elements in the memory array; and a set of switching transistors adapted to switch a supply voltage in accordance with the addressing signal such that current only flows into the array. Optionally, the elements comprise at least one global source bit line (GSBL) adapted to carry the current flowing into the array. Optionally, the GSBL is connected to at least one local source bit line (LSBL). Additionally or alternatively, the LSBL is connected to a source electrode of a memory cell in the memory array.

There is provided, in accordance with an embodiment of the invention, a unidirectional multiplexer (UMUX) for a non-volatile memory (NVM) array, the UMUX comprising two or more address line ports adapted to receive addressing signals corresponding with elements in the memory array, and a set of switching transistors adapted to switch an operating current in accordance with the addressing signal such that current flows out of the array. Optionally, the elements comprise at least one global drain bit line (GDBL) adapted to carry the operating current out of the array. Optionally, the GDBL is connected to at least one local drain bit line (LDBL). Additionally or alternatively, the LDBL is connected to a drain electrode of a memory cell in the memory array.

There is provided, in accordance with an embodiment of the invention, an apparatus comprising a non-volatile memory device, the non-volatile memory comprising an array of memory cells; and a unidirectional multiplexer (UMUX), the UMUX comprising two or more address line ports adapted to receive addressing signals corresponding with elements in the memory array, and a set of switching transistors adapted to switch a supply voltage in accordance with the addressing signal such that current only flows into the array. Optionally, the elements comprise at least one global source bit line (GSBL) adapted to carry the current flowing into the array. Optionally, the GSBL is connected to at least one local source bit line (LSBL).

In some embodiments of the invention, the apparatus further comprises a second UMUX, the second UMUX comprising two or more address line ports adapted to receive addressing signals corresponding with elements in the memory array, and a set of switching transistors adapted to switch an operating current in accordance with the addressing signal such that current flows out of the array. Optionally, the elements comprise at least one global drain bit line (GDBL) adapted to carry the operating current flowing out of the array. Optionally, the GDBL is connected to at least one local drain bit line (LDBL). Additionally or alternatively, the second UMUX is interchangeable with the first UMUX.

In some embodiments of the invention, the apparatus further comprises a multiplexer (Y-MUX), the Y-MUX comprising two or more address line ports adapted to receive addressing signals corresponding with the elements in the memory array, a set of switching transistors adapted to switch a supply voltage in accordance with the addressing signal such that current flows into the array, and a set of switching transistors adapted to switch an operating current in accordance with the addressing signal such that current flows out of the array.

In some embodiments of the invention, the apparatus is a communications device. Optionally, the apparatus is a computer or computer-related device. Optionally, the apparatus is a consumer electronic device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 10A, 10B and 10C schematically show graphic and tabular results of simulations performed on an NVM, in accordance with an embodiment of the invention;

Figure 1:
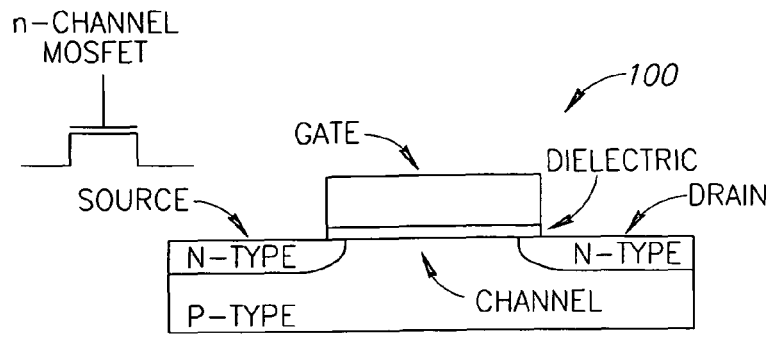
FIG. 1 schematically illustrates an exemplary FET comprising a p-type substrate and two spaced-apart n-type diffusion areas, as known in the art.
Figure 2:
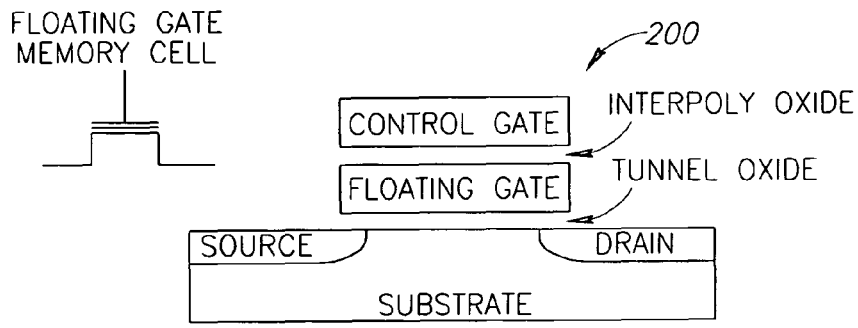
FIG. 2 schematically illustrates an exemplary floating gate transistor comprising two gates, as know in the art.
Figure 3:
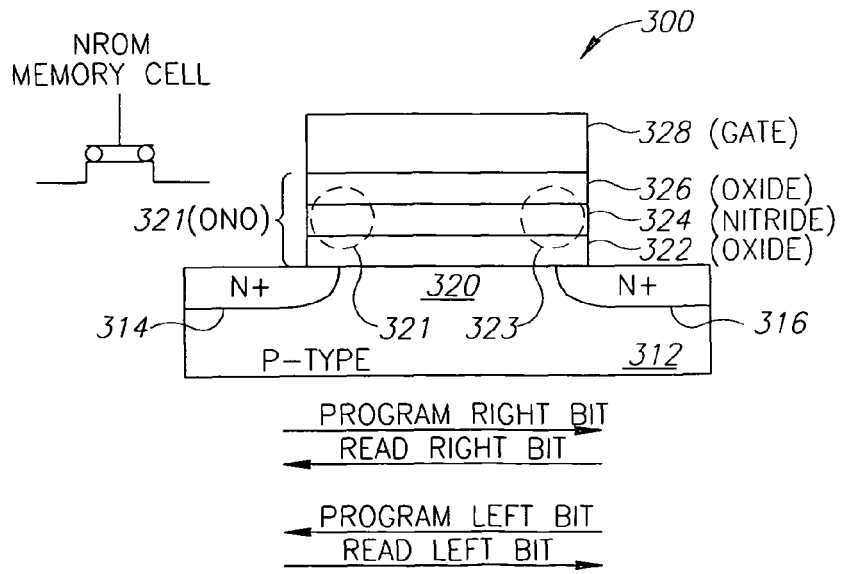
FIG. 3 schematically illustrates a basic exemplary NROM memory cell, as known in the art.
Figure 4A:
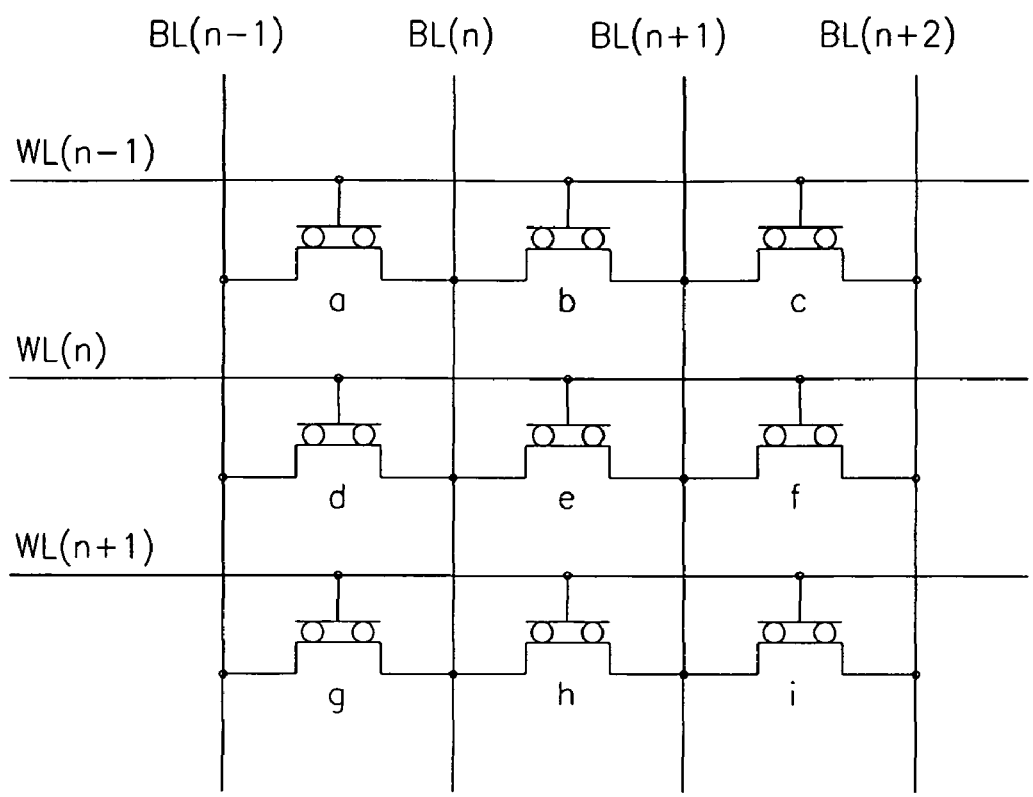
FIG. 4A schematically illustrates an array of NROM memory cells connected to a number of word lines (WL) and bit lines (BL), as known in the art.
Figure 4B:
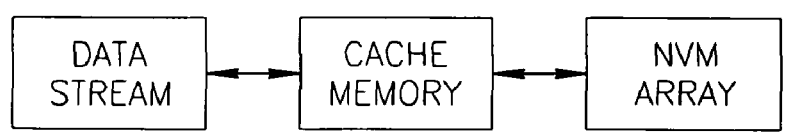
FIG. 4B schematically illustrates a flow chart of buffering in cache memory, as known in the art.
Figure 5A:
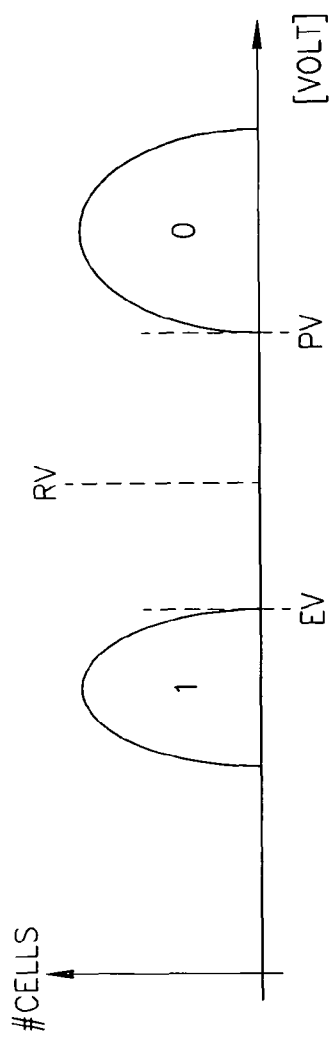
FIG. 5A schematically illustrates a graph showing two states of a "binary" or single level cell (SLC); as known in the art.
Figure 5B:
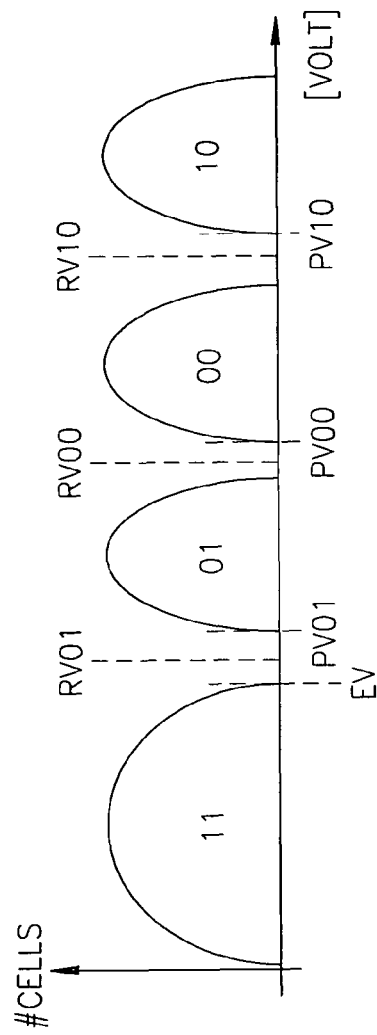
FIG. 5B schematically illustrates four possible MLC program levels (or states) 11, 01, 00, 10 for a memory cell, as known in the art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

adder In electronics, an adder or summer is a digital circuit that performs addition of numbers.

algorithm In mathematics, computing, linguistics, and related disciplines, an algorithm is a definite list of well-defined instructions for completing a task; that given an initial state will proceed through a well-defined series of successive states, eventually terminating in an end-state.

anisotropic literally, one directional. An example of an anisotropic process is sunbathing. Only surfaces of the body exposed to the sun become tanned. (see "isotropic").

array memory cells may optionally be organized in an array of rows and columns, and may be connected to selected bit lines and word lines in the array. The array may be organized into various logical sections containing pluralities of memory cells, such as blocks, pages and sectors. Some of these sections may be physically isolated and operated independently from one another. The array may physically be divided into various sections, which may be referred to as:

Array Area (AA)—memory cells, bit lines, word lines, contacts to bit lines and word lines Cell Area—portion of the Array Area which comprises memory cells Contact Area—a portion of the Array Area devoid of memory cells (and word lines) to allow for BL contacts Periphery Area—a portion of the memory chip, adjacent or surrounding the Array Area, comprising control circuitry, typically CMOS, for operating the Array associative array An associative array (also associative container, map, mapping, hash, dictionary, finite map, lookup table, and in query-processing an index or index file) is an abstract data type composed of a collection of keys and a collection of values, where each key is associated with one value. The operation of finding the value associated with a key is called a lookup or indexing, and this is the most important operation supported by an associative array. The relationship between a key and its value is sometimes called a mapping or binding. For example, if the value associated with the key "bob" is 7, we say that our array maps "bob" to 7.

BER short for bit error rate. In telecommunication, an error ratio is the ratio of the number of bits, elements, characters, or blocks incorrectly received to the total number of bits, elements, characters, or blocks sent during a specified time interval. The most commonly encountered ratio is the bit error ratio (BER)—also sometimes referred to as bit error rate.

binary system The binary numeral system, or base-2 number system, is a numeral system that represents numeric values using only two symbols, usually "0" and "1". Owing to its straightforward implementation in electronic circuitry, the binary system is used internally by virtually all modern computers. Many 1s and 0s can be strung together to represent larger numbers. Starting at the right is the "place" for "ones", and there can be either 0 or 1 one's. The next "place" to the left is for "twos", and there can be either 0 or 10 two's. The next "place" to the left is for "fours", and there can be either 0 or 10 fours. The next "place" to the left is for "eights", and there can be either 0 or 10 eights. This continues for as many places as desired, typically 4, 8, 16, 32 or 64 places. For example, 0000 represents zero (a "0" in all four places)

0001 represents one (a "1" in the ones place, and 0s in all of the other three places)

0010 represents two (a "1" in the twos place, and 0s in the other three places)

0011 represents three (a "1" in the ones place, plus a "1" in the twos place)

0100 represents four (a "1" in the fours place, and 0s in all of the other three places)

1000 represents eight (a "1" in the eights place, and 0s in all of the other three places)

1010 represents ten (a "1" in the eights place, plus a "1" in the twos place)

In binary notation, each "place" to the left of the first (ones) place has a possible value of either 0 or, if there is a "1" in the place, two times the value of the place immediately to the right. Hence, from right (least significant bit) to left (most significant bit), the places have a value of either 0 or 1, 2, 4, 8, 16, 32, 64, 128, and so forth.

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

block code In computer science, a block code is a type of channel coding. It adds redundancy to a message so that, at the receiver, one can decode with minimal (theoretically zero) errors, provided that the information rate (amount of transported information in bits per sec) would not exceed the channel capacity. The main characterization of a block code is that it is a fixed length channel code (unlike source coding schemes such as Huffman coding, and unlike channel coding methods like convolutional encoding). Typically, a block code takes a k-digit information word, and transforms this into an n-digit codeword.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

cache In computer science, a cache is a collection of data duplicating original values stored elsewhere or computed earlier, where the original data is expensive to fetch (due to longer access time) or to compute, compared to the cost of reading the cache. In other words, a cache is a temporary storage area where, for example, frequently accessed data can be stored for rapid access. Once the data is stored in the cache, future use can be made by accessing the cached copy rather than re-fetching or recomputing the original data, so that the average access time is shorter.

cap a term used to describe layers of a material disposed over another, dissimilar material, typically to protect the underlying material from damage during subsequent processing steps. A cap may be left in place, or removed, depending upon the situation.

cell the term "cell" may be used to describe anything, such as a NVM cell, that can store one unit of analog data. This includes FG memory cells, and non-FG memory cells, such as NROM. See half cell.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution.

channel coding In computer science, a channel code is a broadly used term mostly referring to the forward error correction code and bit interleaving in communication and storage where the communication media or storage media is viewed as a channel. The channel code is used to protect data sent over it for storage or retrieval even in the presence of noise (errors).

CHE short for channel hot electron. CHE is an "injection mechanism" for injecting electrons into a charge storage area of an NVM memory cell.

CHEI short for channel hot electron injection. sometimes abbreviated "CHE".

CMOS short for complementary metal oxide semiconductor. CMOS consists of n-channel and p-channel MOS transistors. Due to very low power consumption and dissipation, as well as minimization of the current in "off" state, CMOS is a very effective device configuration for implementation of digital functions. CMOS is a key device in state-of-the-art silicon microelectronics.

CMOS Inverter A pair of two complementary transistors (a p-channel and an n-channel) with the source of the n-channel transistor connected to the drain of the p-channel transistor and the gates connected to each other. The output (drain of the p-channel transistor) is high whenever the input (gate) is low, and the other way round. The CMOS inverter is the basic building block of CMOS digital circuits.

NMOS: n-channel CMOS.
PMOS: p-channel CMOS.

CMP short for chemical-mechanical polishing. CMP is a process, using both chemicals and abrasives, comparable to lapping, for removing material from a built up structure, resulting in a particularly planar resulting structure.

comparator In electronics, a comparator is a device which compares two voltages or currents and switches its output to indicate which is larger. More generally, the term is also used to refer to a device that compares two items of data.

complement In many different fields, the complement of "X" is something that, together with "X", makes a complete whole, something that supplies what "X" lacks. The concept of "complement" has a variety of uses in mathematics and computer science. For example:

a system known as "ones' complement" can be used to represent negative numbers. The ones' complement form of a negative binary number is the bitwise NOT applied to it—the complement of its positive counterpart.

a "two's complement" of a binary number is defined as the value obtained by subtracting the number from a large power of two (specifically, from 2N for an N-bit two's complement).

convolutional code In telecommunication, a convolutional code is a type of error-correcting code in which (a) each m-bit information symbol (each m-bit string) to be encoded is transformed into an n-bit symbol, where m/n is the code rate (n≧m) and (b) the transformation is a function of the last k information symbols, where k is the constraint length of the code.

distribution overlap A number of cells programmed at a given program level may exhibit a distribution of threshold voltages. Usually, the distribution for one program level is separated from a distribution for another program level. However, due to threshold drift, one or both of the distrubutions may move towards the other, causing some of the threshold voltages to be the same. The region where the threshold voltages are the same for cells programmed at two different program levels is the distribution overlap.

disturb When applying a pulse to a specific bit by raising WL and BL voltages, neighboring bits located on the same WL or same BL might suffer from Vt shift that cause margin loss. The shift is called "disturb". Disturbs are a fault type where the content of a cell is unintentionally altered when operating on another cell. These faults have similar characteristics to coupling faults, however, they have special neighborhood requirements.

Disturb faults are generally caused by the presence of high/intermediate electric field stress on an insulating layer within the core memory cell. This electric field results in leakage current caused either by FN-tunneling, punch-through, or channel hot electron injection. Whether a given mechanisms is responsible for a particular disturb is a function of the operating conditions and the state of the investigated cell. The IEEE Standard Definition and Characterization of Floating Gate Semiconductor Arrays disturb faults can be divided into the following:

Word-line erase disturb (WED): Exists when a cell under program (selected cell) causes another unprogrammed cell (unselected cell), sharing the same wordline, to be erased.

Word-line program disturb (WPD): Exists when a cell under program (selected cell) causes another unprogrammed cell (unselected cell), sharing the same wordline, to be programmed.

Bit-line erase disturb (BED): Exists when a cell under program (selected cell) causes another unprogrammed cell (unselected cell), sharing the same bit-line, to be erased.

Bit-line program disturb (BPD): Exists when a cell under program (selected cell) causes another unprogrammed cell (unselected cell), sharing the same bitline, to be programmed.

Read disturb (RD): During read operation, the bias conditions are the same as programming conditions (except for lower voltage magnitudes) and can result in the injection of electrons from drain to FG, thus programming the selected cell. This is known as a soft program. In addition, unselected erased cells may become programmed, and those that are programmed may become erased, giving rise to what is known as gate read erase and channel read program, respectively. Both of these disturbs that occur on un-addressed cells are considered to be another form of read disturbs.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

ECC short for error correcting code. An error-correcting code (ECC) is a code in which each data signal conforms to specific rules of construction so that departures from this construction in the received signal can generally be automatically detected and corrected. It is used in computer data storage, for example in dynamic RAM, and in data transmission. Some codes can correct a certain number of bit errors and only detect further numbers of bit errors. Codes which can correct one error are termed single error correcting (SEC), and those which detect two are termed double error detecting (DED). Hamming codes can correct single-bit errors and detect double-bit errors—SEC-DED. More sophisticated codes correct and detect even more errors.

An error-correcting code which corrects all errors of up to n bits correctly is also an error-detecting code which can detect at least all errors of up to 2n bits. Two main categories are convolutional codes and block codes. Examples of the latter are Hamming code, BCH code, Reed-Solomon code, Reed-Muller code, Binary Golay code, and low-density parity-check codes.

ED bits as used herein, ED bits are numbers which may be calculated for and stored along with data being programmed (stored), which are indicative of the number of cells (or half-cells) at any given program level, for example, 512 cells (or half cells) at program level "10". During a subsequent read operation, the ED bits may be retrieved along with the data which was stored, the number of cells at the given program levels are counted, and these counts are compared with the ED bits. If there is a mismatch, this indicates a read error, and an error correction scheme such as "moving read reference" can be implemented. See moving read reference.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and, more typically, a full Page. While an erase and rewrite of a location appears nearly instantaneous to the user, the write process is usually slightly slower than the read process; the chip can usually be read at full system speeds.

endurance Because they are written by forcing electrons through a layer of electrical insulation onto a floating gate (or charge trapping medium), some NVM can withstand only a limited number of write and erase cycles before the insulation is permanently damaged, and the ability of the cell to function correctly is compromised. In modern Flash EEPROM, the endurance may exceed 1,000,000 write/erase cycles.

EPROM short for erasable, programmable read only memory. EPROM is a memory cell in which information (data) can be erased and replaced with new information (data).

erase a method to erase data on a large set of bits in the array, by applying a voltage scheme that injects holes in the bit set. This method causes all bits to reach a low Vt level. See program and read.

Error Detection and Correction In computer science, telecommunication, and information theory, error detection and correction has great practical importance in maintaining data (information) integrity across noisy channels and less-than-reliable storage media. More particularly, Error detection is the ability to detect the presence of errors caused by noise or other impairments during transmission from the transmitter to the receiver.

Error correction is the additional ability to reconstruct the original, error-free data.

FEC short for forward error correction. In telecommunication, forward error correction (FEC) is a system of error control for data transmission, whereby the sender adds redundant data to its messages, which allows the receiver to detect and correct errors (within some bounds), without the need to ask the sender for additional data. The advantage of forward error correction is that retransmission of data can often be avoided, at the cost of higher bandwidth requirements on average, and is therefore applied in situations where retransmissions are relatively costly or impossible.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

FG short for floating gate. The floating-gate transistor is a kind of transistor that is commonly used for non-volatile storage such as flash, EPROM and EEPROM memory. Floating-gate transistors are almost always floating-gate MOSFETs.

Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed. Flash memory architecture allows multiple memory locations to be erased or written in one programming operation. Two common types of flash memory are NOR ("Not Or") and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND ("Not And") flash, cells are connected in series, resembling a NAND gate, and preventing cells from being read and programmed individually: the cells connected in series must be read in series.

flip-flop In electronics, an electronic circuit which has two stable states and thereby is capable of serving as one bit of memory. A flip-flop is usually controlled by one or two control signals and/or a gate or clock signal. The output often includes the complement as well as the normal output. As flip-flops are implemented electronically, they naturally also require power and ground connections.

FN tunneling Field emission—also called Fowler-Nordheim tunneling—is the process whereby electrons tunnel through a barrier in the presence of a high electric field. This quantum mechanical tunneling process is an important mechanism for thin barriers such as those in metal-semiconductor junctions on highly-doped semiconductors. Using FN tunneling, electrons can be moved to the floating gate of a MOSFET memory cell.

Gray code The reflected binary code, also known as Gray code after Frank Gray, is a binary numeral system where two successive values differ in only one digit. The reflected binary code was originally designed to prevent spurious output from electromechanical switches. Today, Gray codes are widely used to facilitate error correction in digital communications. An example of a two-bit binary Grey code sequence is 00, 01, 11, 10. An example of a three-bit binary Grey code sequence is 000, 001, 011, 010, 110, 111, 101, 100.

half cell "half cell" (or "half-cell") is a term which is sometimes used to refer to the two distinct charge storage areas (left and right bits) of an NROM memory cell.

Hamming code In telecommunication, a Hamming code is a linear error-correcting code named after its inventor, Richard Hamming. Hamming codes can detect and correct single-bit errors. In other words, the Hamming distance between the transmitted and received code-words must be zero or one for reliable communication. Alternatively, it can detect (but not correct) up to two simultaneous bit errors. In contrast, the simple parity code cannot correct errors, nor can it be used to detect more than one error (such as where two bits are transposed).

HHI short for hot hole injection. HHI is an "injection mechanism" for injecting holes into a charge storage area of an NVM memory cell. See CHE.

Information theory Information theory is a branch of applied mathematics and engineering involving the quantification of information. Historically, information theory developed to find fundamental limits on compressing and reliably communicating data. A key measure of information that comes up in the theory is known as information entropy, which is usually expressed by the average number of bits needed for storage or communication. Intuitively, entropy quantifies the uncertainty involved in a random variable. For example, a fair coin flip will have less entropy (2 possible outcomes) than a roll of a die (6 possible outcomes).

Inhibit If it is desired to apply erase to a subset of bits, avoiding erase from other bits sharing the same bit lines (BLs), an inhibit signal may be applied on the others, for example, as a positive voltage on the gate, to avoid hole injection. This procedure is called inhibit.

mask a layer of material which is applied over an underlying layer of material, and patterned to have openings, so that the underlying layer can be processed where there are openings. After processing the underlying layer, the mask may be removed. Common masking materials are photoresist and nitride. Nitride is usually considered to be a "hard mask".

LDPC short for low-density parity check. In information theory, a low-density parity-check code (LDPC code) is an error correcting code, a method of transmitting a message over a noisy transmission channel. While LDPC and other error correcting codes cannot guarantee perfect transmission, the probability of lost information can be made as small as desired. LDPC was the first code to allow data transmission rates close to the theoretical maximum, the Shannon Limit. See, for example, the article "LDPC: Another Key Step Toward Shannon, New low-density parity check (LDPC) error correction techniques push wireless and networking channel performance closer to the Shannon Limit. Here's How.", by Tony Summers, Comtech AHA Corporation, Oct. 14, 2004, incorporated by reference herein.

logical operators A logical connective, also called a truth-functional connective, logical operator or propositional operator, is a logical constant which represents a syntactic operation on a sentence, or the symbol for such an operation that corresponds to an operation on the logical values of those sentences. A logical connective serves to return (results in) a "true" or "false" value (such as binary "0" or binary "1") when applied to arguments (operators) also having true or false values. For example, some common logical operators are:

AND the AND operator results in a value of "true" only if both of the operands (A,B) has a value of "true". (In binary terms, if A="1" and B="1", then the result is "1". Otherwise, the result is "0".)

OR the OR operator results in a value of "true" if one or the other, or both of the operands (A,B) has a value of "true". (In binary terms, if either one of A or B="1" and B="1", the result is "1". Otherwise, the result is "0".)

XOR short for exclusive "or". the XOR operator results in a value of "true" if and only if exactly one of the operands (A,B) has a value of "true". (In binary terms, if only one of A or B="1" and B="1", the result is "1". Otherwise, the result is "0".)

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

moving read reference as used herein, "moving read reference" (or "moving reference") refers to a technique, such as disclosed in U.S. Pat. No. 6,992,932 wherein reference voltages are determined to be used in reading cells programmed to a given program state. Generally, if an error is detected, such as by using error detection (ED) bits, the reference voltages may have to be adjusted until the error is resolved. See ED bits.

multiplexer In electronics, a multiplexer or mux is a device that performs multiplexing: it selects one of many analog or digital data sources and outputs that source into a single channel.

nitride commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material.

n-type semiconductor in which concentration of electrons is higher than the concentration of "holes". See p-type.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations, which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.) NVM includes floating gate (FG) devices and NROM devices, as well as devices using optical, magnetic and phase change properties of materials.

ONO short for oxide-nitride-oxide. ONO is used as a charge storage insulator consisting of a sandwich of thermally insulating oxide, and charge-trapping nitride.

over-erase a condition that happens to some bits in a large bit set that are erased together, due to erase speed difference, due to the situation that some bits erase faster than other bits. Fast bits are particularly susceptible to over-erase. See erase.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In), and the like.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PFROM short program flash ROM. An inner design block (of Saifun) that stores instructions that the inner embedded microcontroller performs on flash devices.

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

program rate as used herein, "program rate" refers to the number of times that a memory cell (or half cell) is programmed to various program (or threshold voltage) levels, such as representing a binary "1" or "0".

Program time refers to the duration of a single program pulse, or the duration of the whole program sequence algorithm to program a bit set.

Programmed "programmed" generally means that the threshold voltage (Vt) of a cell is above a predetermined "program verify" level (Vth).

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

read a method to read the digital data stored in the array. The read operation is usually performed in "blocks" of several cells. See erase and program.

Reed-Solomon Reed-Solomon error correction is an error-correcting code that works by oversampling a polynomial constructed from the data. The polynomial is evaluated at several points, and these values are sent or recorded. By sampling the polynomial more often than is necessary, the polynomial is over-determined. As long as "many" of the points are received correctly, the receiver can recover the original polynomial even in the presence of a "few" bad points.

refresh a part of the program or erase algorithms that checks the status of bits and applies pulses to bits that may have lost some of their Vt due to reliability margin loss.

register In electronics, a register is a small amount of storage whose contents can be accessed more quickly than storage available elsewhere. Registers are normally measured by the number of bits they can hold, for example, an "8-bit register" or a "32-bit register". Registers are now usually implemented as a register file, but they have also been implemented using individual flip-flops.

resist short for photoresist; also abbreviated "PR". Photoresist is often used as a masking material in photolithographic processes to reproduce either a positive or a negative image on a structure, prior to etching (removal of material which is not masked). PR is usually washed off after having served its purpose as a masking material.

retention Retention generally refers to the ability of a memory cell to retain charges inserted into the charge storage medium, such as a floating gate. The data retention of EPROM, EAROM, EEPROM, and Flash may be limited by charge leaking from the floating gates of the memory cell transistors. Leakage is exacerbated at high temperatures or in high-radiation environments.

ROM short for read-only memory.

salicide The term salicide refers to a technology used in the microelectronics industry for the purpose of reducing the sheet resistance of the exposed silicon and poly-silicon areas. The salicide process involves the reaction of a thin metal film with silicon ultimately forming a metal silicide through a series of annealing and/or etch processes. The term "salicide" is a compaction of the phrase self-aligned silicide. The description "self-aligned" suggests that the silicide formation does not require lithographic patterning processes, as opposed to a non-aligned technology such as polycide. The term salicide is also used to refer to the metal silicide formed by the contact formation process, such as "titanium salicide", although this usage is inconsistent with accepted naming conventions in chemistry. The salicide process may begin with deposition of a thin transition metal layer over fully formed and patterned semiconductor devices (such as transistors). The wafer is heated, allowing the transition metal to react with exposed silicon (such as source, drain, gate) forming a low-resistance transition metal silicide. The transition metal does not react with the silicon oxide and or nitride insulators present on the wafer. Following the reaction, any remaining transition metal is removed by chemical etching, leaving silicided silicon. The silicided silicon is then further heat treated to form a lower resistance silicide.

scientific notation Scientific notation, also known as standard form, is a notation for writing numbers that is often used by scientists and mathematicians to make it easier to write large and small numbers. A number that is written in scientific notation has several properties that make it very useful to scientists.

The basic concept for the practical notations is this mathematical exponential expression using powers of ten, for example: $a \times 10^b$ ("a" times ten raised to the "b"th power).

"E notation" is related to, and a form of scientific notation. Most calculators and many computer programs present very large and very small results in scientific notation. Because exponents like $10^7$ (ten to the seventh power) cannot always be conveniently represented on computers, typewriters, and calculators, an alternate notation, "E notation" is often used: the letter "E" or "e" is used for "times ten raised to the power", with all numbers being written on the same line, without superscripts, for example "$3 \times 10^{13}$" (three times 10 to the $13^{th}$ power, or a "1, followed by 12 zeroes) would be written as "3E13".

sector a part of the array, usually larger than a page, which usually contains a few pages. A minimum erase might include a sector. For example:

Erase Sector (ES): Group of cells that are erased by single erase command

Physical Sector (PS): Group of ES connected by single grid of Word Lines (WL) and Bit Lines (BL), sharing same set of drivers.

self-aligned In fabrication of MOSFETs on integrated circuits, a self-aligned gate is an arrangement where the edges of the source and drain doping regions next to the gate are defined by the same mask that defines the edges of the gate next to the source and drain regions. An overlap between the source, drain and gate regions would be difficult to achieve without the self-aligned feature (due to the inherent misalignment between different masking layers). "Self-aligned" may also refer to any process step where a previously-formed structure acts as a mask for a subsequent process step, such as deposition or etching.

Shannon Limit Information theory is generally considered to have been founded in 1948 by Claude Shannon in his seminal work, "A Mathematical Theory of Communication" The Bell System Technical Journal, Vol. 27, pp. 379-423, 623-656, July, October 1948, herein incorporated by reference in its entirety. The central paradigm of classical information theory is the engineering problem of the transmission of information over a noisy channel. The most fundamental results of this theory are Shannon's source coding theorem, which establishes that, on average, the number of bits needed to represent the result of an uncertain event is given by its entropy; and Shannon's noisy-channel coding theorem, which states that reliable communication is possible over noisy channels provided that the rate of communication is below a certain threshold called the channel capacity. The channel capacity can be approached by using appropriate encoding and decoding systems.

Shannon's theorem is an important theorem in error correction which describes the maximum attainable efficiency of an error-correcting scheme versus the levels of noise interference expected. In general, these methods put redundant information into the data stream following certain algebraic or geometric relations so that the decoded stream, if damaged in transmission, can be corrected. The effectiveness of the coding scheme is measured in terms of code rate, which is the code length divided by the useful information, and the coding gain, which is the difference of the SNR levels of the uncoded and coded systems required to reach the same BER levels. Shannon's noisy-channel coding theorem states that reliable communication is possible over noisy channels provided that the rate of communication is below a certain threshold called the channel capacity, or "Shannon Limit".

Si Silicon, a Semiconductor.

SLC short for single level cell. In the context of a floating gate (FG) memory cell, SLC means that one bit of information can be stored in the memory cell. In the context of an NROM memory cell, SLC means that at least two bits of information can be stored in the memory cell.

SNR short for signal-to-noise ratio. SNR (often abbreviated SNR or S/N) is an electrical engineering concept, also used in other fields (such as scientific measurements, biological cell signaling and oral lore), defined as the ratio of a signal power to the noise power corrupting the signal. In less technical terms, signal-to-noise ratio compares the level of a desired signal (such as music) to the level of background noise. The higher the ratio, the less obtrusive the background noise is.

SONOS Si-Oxide-Nitride-Oxide-Si, another way to describe ONO with the Si underneath and the Poly gate on top.

spacer a spacer, as the name implies, is a material (such as a layer of oxide) disposed on an element (such as a poly gate electrode). For example, sidewall spacers disposed on opposite sides of a gate electrode structure cause subsequent implants to occur further away from the gate than otherwise (without the spacers in place), thereby controlling (increasing) the length of a channel under the gate electrode structure.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

standard deviation In probability and statistics, the standard deviation of a probability distribution, random variable, or population or multi-set of values is a measure of the spread of its values. It is usually denoted with the letter a (lower case sigma). It is defined as the square root of the variance. To understand standard deviation, keep in mind that variance is the average of the squared differences between data points and the mean. Variance is tabulated in units squared. Standard deviation, being the square root of that quantity, therefore measures the spread of data about the mean, measured in the same units as the data. Said more formally, the standard deviation is the root mean square (RMS) deviation of values from their arithmetic mean.

The standard deviation is a measure of statistical dispersion. In plain English, it's a way of describing how spread out a set of values are around the mean of that set.

For example, if you have a set of height measurements, you can easily work out the arithmetic mean (just sum up all the individual height measurements and then divide by the number of those measurements). However, knowing the mean (or average, as it's more commonly called), doesn't tell you about the spread of those heights. Were all the people in your group the same height, or did you have some tall and some short, or was there one really tall person who towered over everybody else? It's possible that you could have exactly the same average height from wildly different groups. Knowing about how spread out those heights are compared to the mean gives you extra information over and above the mean value.

Units of Length Various units of length may be used herein, as follows:

meter (m) A meter is the SI unit of length, slightly longer than a yard.

1 meter=~39 inches. 1 kilometer (km)=1000 meters=~0.6 miles. 1,000,000 microns=1 meter. 1,000 millimeters (mm)= 1 meter.

100 centimeters (cm)=1 meter.

micron (μm) one millionth of a meter (0.000001 meter); also referred to as a micrometer.

mil ¹⁄₁₀₀₀ or 0.001 of an inch; 1 mil=25.4 microns.

nanometer (nm) one billionth of a meter (0.000000001 meter).

Angstrom (Å) one tenth of a billionth of a meter. 10 Å=1 nm.

verify a read operation, after applying a program or erase pulse, that checks if the applied program or erase pulse moved the Vt to the target level (program-verify or erase-verify level).

V short for voltage. Different voltages may be applied to different parts of a transistor or memory cell to control its operation, such as:

Vb short for bulk (or substrate) voltage

Vd short for drain voltage

Vg short for gate voltage

Vs short for source voltage

Vt short for threshold voltage wear leveling Wear levelling (also written wear leveling) refers to a technique for prolonging the service life of some kinds of erasable computer storage media, such as flash memory. EEPROM and flash memory media have individually erasable segments, each of which can be put through a finite number of erase cycles before becoming unreliable. This can be anywhere between 10,000 and 1,000,000 cycles, for example, for NAND flash devices. Wear-levelling attempts to work around these limitations by arranging data so that erasures and re-writes are distributed evenly across the medium. In this way, no single sector prematurely fails due to a high concentration of write cycles.

word line or wordline, (WL). A conductor normally connected to the gate of a memory cell transistor. The wordline may actually be the gate electrode of the memory cell.

write a combined method usually involving first erasing a large set of bits, then programming new data into the bit set; the erase step is not required but it is customary. See erase and program.

In addition to the above, some abbreviations or terminology that may be used herein, or in a provisional application (if any) from which this non-provisional application claims priority, may include:

| | |
|---|---|
| addr | short for adder |
| bpc, b/c, [b/c] | short for bits per cell (or half-cell, depending on context) |
| comp | short for comparator |
| DPM | short for defects per million |
| ECC | short for error correction code |
| ED | short for error detection |
| FF | short for flip-flop |
| IECC | short for internal error correction |
| LSB | short for least significant bit |
| MSB | short for most significant bit |
| mux | short for multiplexer |
| OTP | short for one time programmable |
| Rd | short for read |
| sigma bits | a type of error correction bits |

Figure 6:
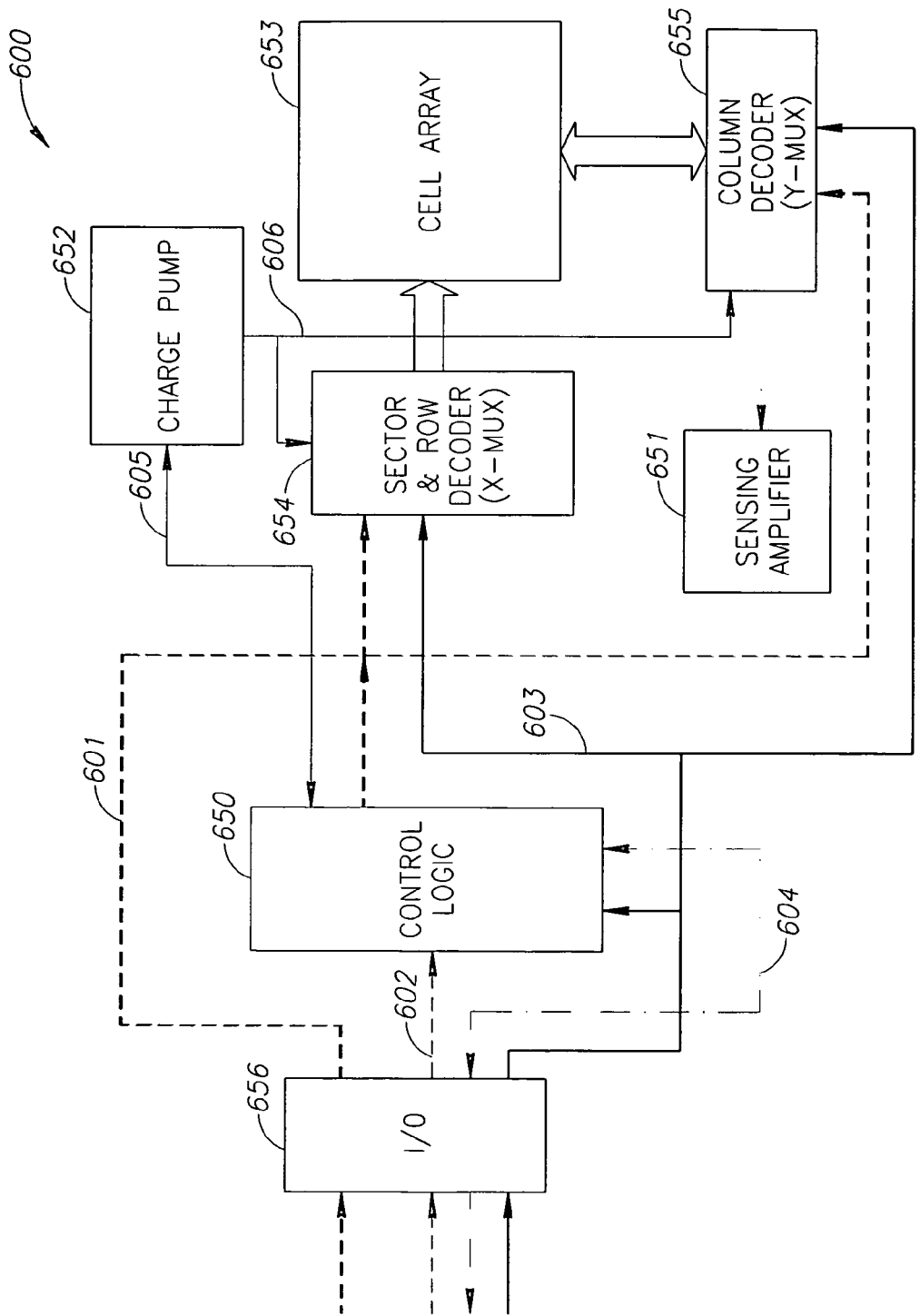
FIG. 6 schematically illustrates a basic, functional block diagram of an exemplary non-volatile memory (NVM), as known in the art.

Reference is made to FIG. 6, which schematically illustrates a basic, functional block diagram of an exemplary non-volatile memory 600 (NVM) known in the art. NVM 600 comprises a primary control circuit (control logic) 650, a sensing amplifier 651, a charge pump/voltage regulator 652, a memory cell array 653, a sector/row decoder (X-MUX) 654, a column decoder (Y-MUX) 655, and an input/output interface module 656.

Control logic 650 comprises a primary control circuitry adapted to control a majority of the functional blocks comprised in NVM 600. Control logic 650 is further adapted to decode and execute commands issued by an externally located host processor (not shown), including executing algorithms associated with reading, programming (writing) and erasing data in cell array 653. Control logic 650 is also adapted to interface with components and/or devices, externally located with respect to NVM 600, through I/O interface 656. Interfacing with the external components and/or devices comprises an input address bus 601 adapted to transfer from the host processor an address of a byte or word to be read from cell array 653, or a sector in the array to be erased; a control line 602 through which chip control signals such as, for example, chip enable, chip reset, write enable and read enable are transferred from the host processor; an input data bus 603 through which data and commands may be transferred from the host processor to the different functional blocks in NVM 600; and an output data bus 604 through which data may be read from memory array 653 and from the other functional blocks in NVM 600. Frequently, input data bus 603 and output data bus 604 are the same data bus. I/O interface 656 is generally adapted to buffer between the functional blocks comprised in NVM 600 and external components and devices. I/O interface 656 is generally further adapted to protect the functional blocks from electrostatic discharge.

Cell array 653 comprises an array of memory cells as known in the art, each cell adapted to store one, or optionally more, bits (for example, two bits). The memory cells may be Floating Gate (FG) flash memory, SONOS (Silicon Oxide Nitride Oxide Semiconductor), TANOS (Tantalum Nitride Oxide Semiconductor), NROM (Nitride Read Only Memory), or other type of memory cells used in NVM. For example, cell array 653 may comprise one big array with a bit line extending along a length of each column from Y-MUX 655, and a word line extending along a length of each row from X-MUX 654. As another example, memory cell array 653 may be of the virtual ground type such as that described in U.S. Pat. No. 6,975,536 B2; "Mass Storage Array And Methods For Operation Thereof", incorporated herein by reference in its entirety.

Sector/row decoder (X-MUX) 654 is adapted to enable a sector and a row in memory cell array 653, based on instructions received from control logic 650, so that the memory cells in the enabled sector and row may be read, programmed and/or erased. Column decoder (Y-MUX) 655 is adapted to enable a column in cell array 653 so that the memory cells in the enabled column may be read, programmed and/or read. Charge pump/voltage regulator 652 comprises analog circuitry adapted to generate voltages for reading, programming and/or erasing the memory cells in cell array 653. The voltage signals are transferred through X-MUX 654 and/or Y-MUX 655, as shown by lines 606, responsive to a control signal 605 from control logic 650.

Sensing amplifier 651 is adapted to sense relatively low bit voltages and small currents typically associated with reading operations in memory cells, and is further adapted to convert them to levels which may be processed by control logic 650. Sensing amplifier 651 generally comprises a plurality of amplifiers, one amplifier per bit column in cell array 603.

Figure 7:
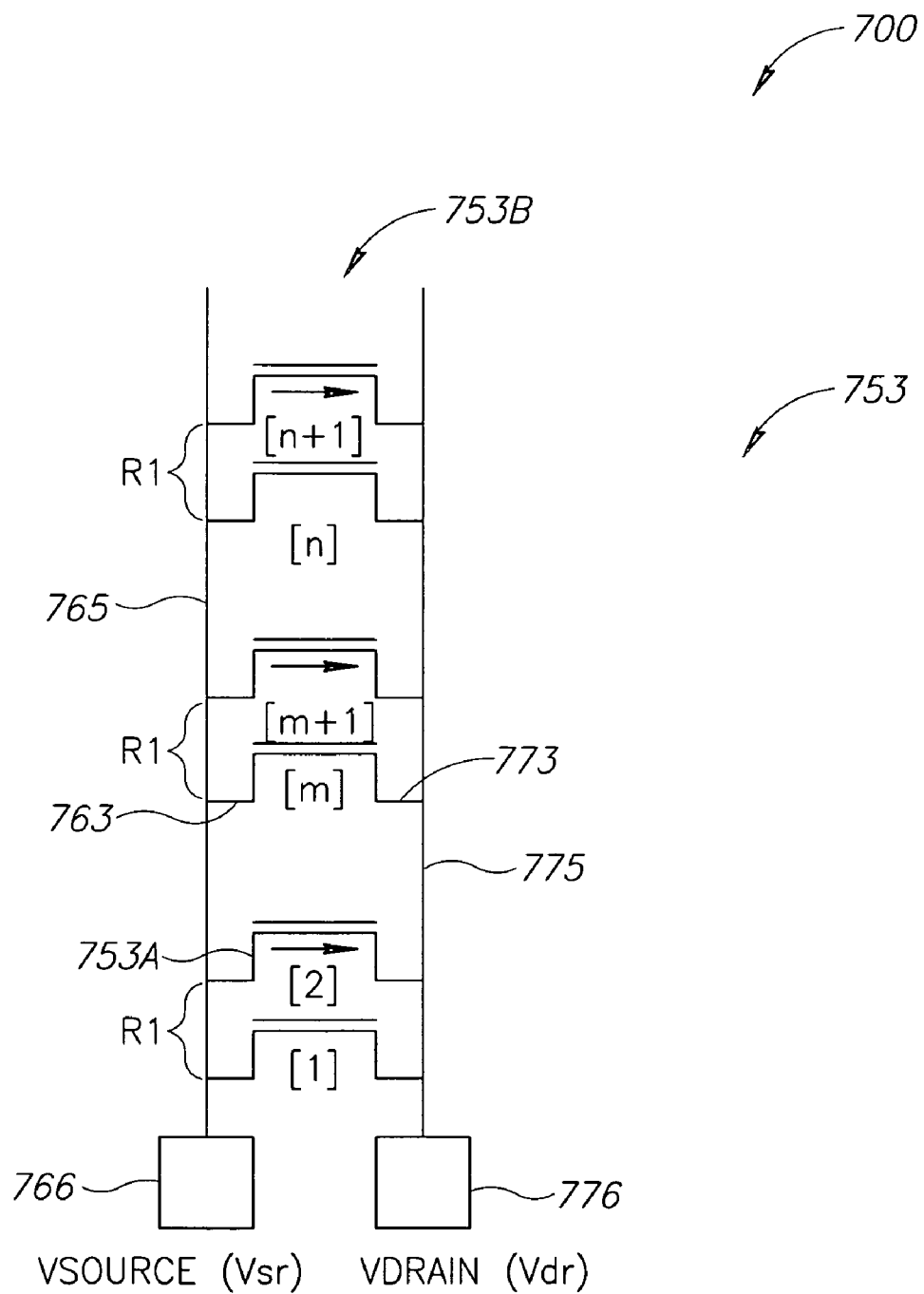
FIG. 7 schematically illustrates an exemplary sector bank in a memory cell array comprised in an NVM, as known in the art.

Reference is made to FIG. 7 which schematically illustrates an exemplary sector bank 753B in a memory cell array 753 comprised in an NVM 700, as known in the art. NVM 700, including memory cell array 753 may be similar to that shown in FIG. 6 at 600 and 653 respectively. Sector bank 753B includes a plurality of n+1 sector 753A and is representative of any column of sectors in array 753. Each sector 753A includes memory cells (not shown) comprising Floating Gate (FG) flash memory, SONOS (Silicon Oxide Nitride Oxide Semiconductor), TANOS (Tantalum Nitride Oxide Semiconductor), NROM (Nitride Read Only Memory), or other type of memory cells used in NVM. Source electrodes in the memory cells in sector 753A are connected through a local source bit line (LSBL) 763 to a global source bit line (GSBL) 765. GSBL 765 connects to a Y-MUX (not shown) at one end of array 753 and thereon to a voltage source regulator Vsr 766. Drain electrodes in the memory cells in each sector 753A are connected through a local drain bit line (LDBL) 773 to a global drain bit line (GDBL) 775. GDBL 775 connects to the Y-MUX and thereon to a voltage drain 776 such as, for example, a sense amplifier or a drain voltage regulator. A connection between GSBL 765 and GDBL 775 to LSBL 763 and LDBL 773, respectively, is typically done through a select transistor (not shown).

A problem typically encountered in memory cell array 753, wherein GSBL 765 and GDBL 775 are connected through the same Y-MUX to Vsr 766 and Vdr 776, respectively, is that a drain to source voltage Vds varies between the memory cells in different sectors due to an IR drop (voltage drop) along GSBL 765 and GDBL 775. That is, the further away along GSBL 765 sector 753A is from Vsr 766, and/or the further away along GDBL 775 sector 753A is from Vdr 776, the greater is the IR drop along the way and the lower Vds is for the cells in the respective sector.

Vds at each memory cell in sector 753A may be expressed by the following equation:

$$Vds(m+1)=Vdr-Vsr-i(m*2R1)$$

where,

Vds (m+1) is Vds at a memory cell in sector [m+1] 753A in sector bank 753B;
Vdr is voltage of drain regulator Vdr 776;
Vsr is voltage of source regulator Vsr 766;
i is the current flowing between source and drain in the memory cells in sector [m];
m is the number of sectors 753A in sector bank 753B between Vsr 766 and/or Vdr 776 and sector (m+1); and
R1 is the bit line resistance of GSBL 765 and GDBL 775 between each successive sector 753A in sector bank 753B, for example, sector [n] and sector [n+1].

The above equation, as well as all other equations which may follow below for determining Vds and Vs in the different embodiments shown, do not take into consideration LBL resistance, nor resistance between Vdr and/or Vsr and first sector [1].

Variations in Vds between memory cells in memory array 753 may cause a degradation of programming and/or reading operations at different locations in the array, particularly at locations further away from Vsr 766 and/or Vdr 776.

A second problem typically encountered is a development of a relatively large voltage on the source electrode of the memory cells (the voltage increases as the distance from the source regulators increases along the bit line, due to the increased bit line resistance). The relative large voltage on the source electrode may cause degradation of programming and/or reading operations. The relatively high voltage which develops at the source electrode may be compensated for by reducing the current in the bit lines, although this is generally not a favorable solution as the program and read operations may be affected.

Vs (voltage at source electrode) in each memory cell in sector 753A may be expressed by the following equation:

$$Vs(m+1)=Vsr+imR1$$

Vs (m+1) is Vs at a memory cell in sector [m+1] 753A in sector bank 753B;
Vdr is voltage of drain regulator Vdr 776;
Vsr is voltage of source regulator Vsr 766;
i is the current flowing between source and drain in the memory cells in sector [m];
m is the number of sectors 753A in sector bank 753B between Vsr 766 and/or Vdr 776 and sector (m+1); and
R1 is the bit line resistance of GSBL 765 and GDBL 775 between each successive sector 753A in sector bank 753B, for example, sector [n] and sector [n+1].

Figure 8A:
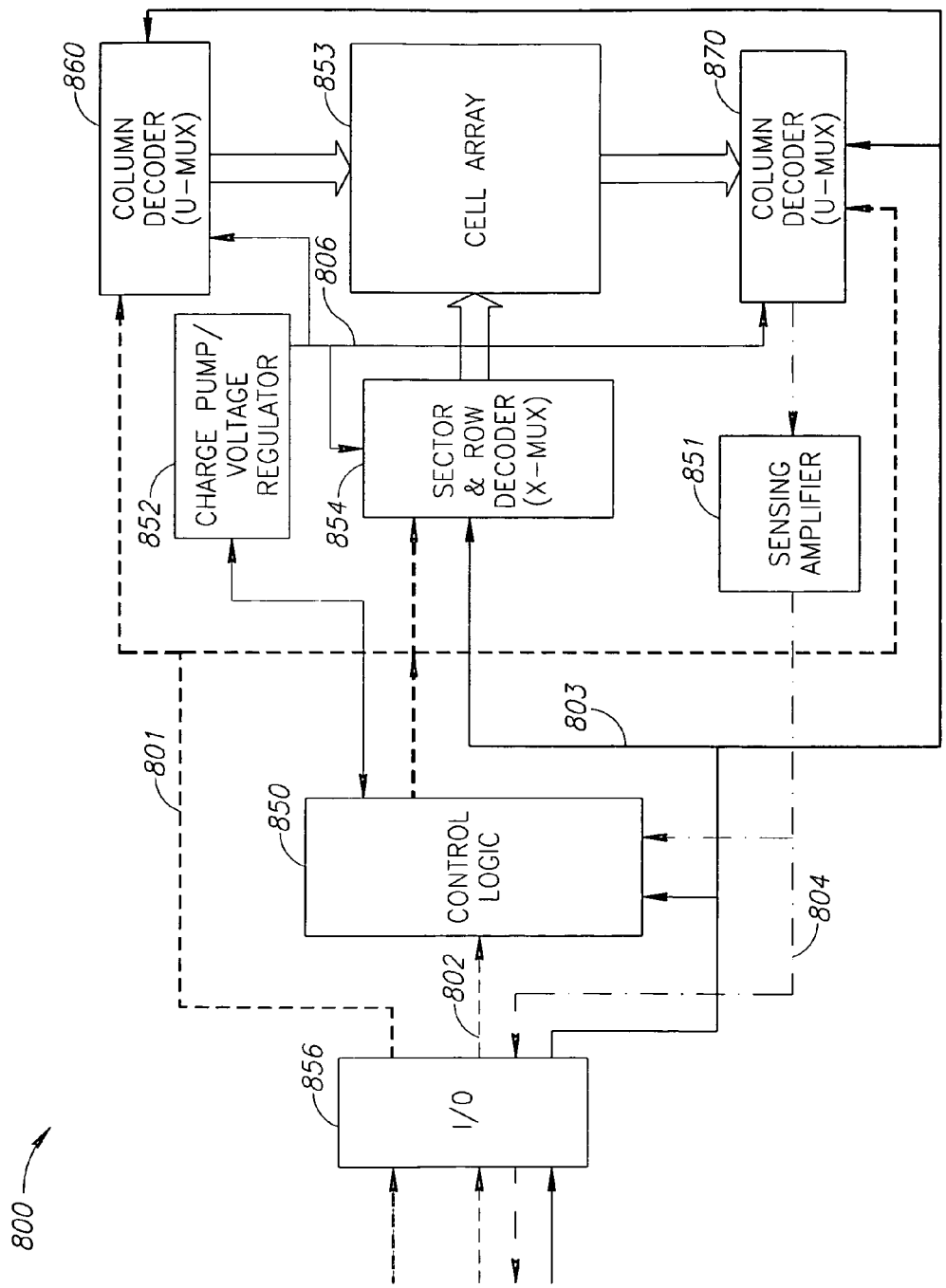
FIG. 8A schematically illustrates a functional block diagram of an exemplary non-volatile memory (NVM), in accordance with an embodiment of the invention.
Figure 8B:
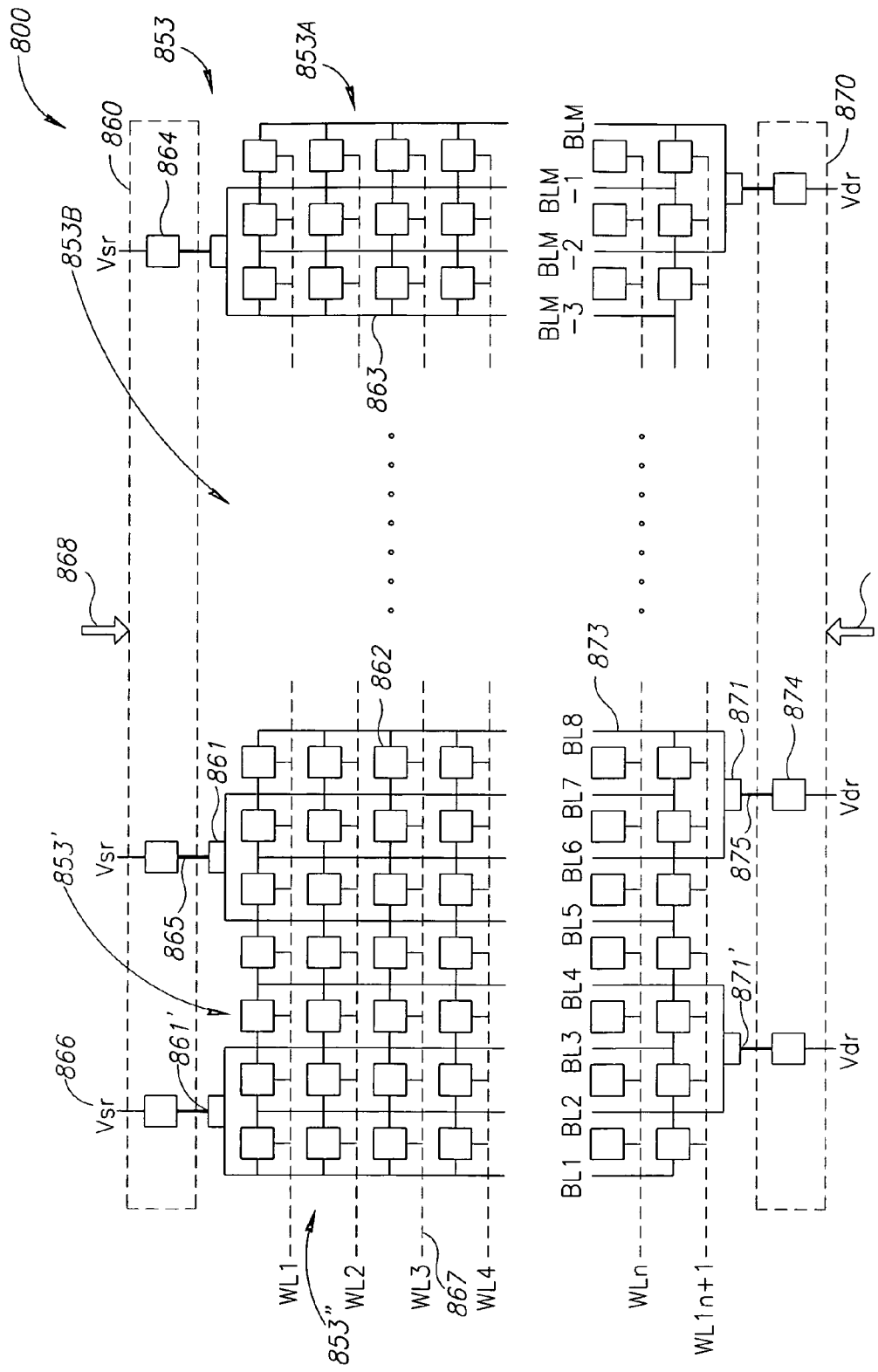
FIG. 8B schematically illustrates an arbitrary sector in a memory cell array, a first unidirectional column decoder (UMUX), and a second UMUX, all comprised in the NVM of FIG. 8A, in accordance with an embodiment of the invention.

Reference is made to FIG. 8A, which schematically illustrates a functional block diagram of an exemplary non-volatile memory 800 (NVM); and to FIG. 8B which schematically illustrates a sector 853A in an NVM array 853, a first uni-directional column decoder (UMUX) 860, and a second UMUX 870, all comprised in NVM 800; both in accordance with an embodiment of the invention. NVM 800 additionally comprises a primary control circuit (control logic) 850, a sense amplifier 851, a charge pump/voltage regulator 852, NVM cell array 853, a sector/row decoder (X-MUX) 854, UMUX 860, UMUX 870, and an input/output interface module 856. UMUX may also be referred to as a uni-directional array access multiplexer. In some embodiments of the invention, sense amplifier 851, which may be the same to that shown in FIG. 6 at 651, may be replaced, or may be in addition to, a drain regulator and or other circuitry adapted to be connected to UMUX 870, as may be known to a person skilled in the art. Primary control circuit 850, charge pump/voltage regulator 852, memory cell array 853, X-MUX 854, and input/output interface module 856 may be the same as that shown in FIG. 6 at 650, 652, 653, 654, and 656. Address bus 801, control lines 802, input data bus 803, and output data bus 804, may be the same as that shown in FIG. 6 at 601, 602, 603, and 604. Optionally, input data bus 803 and output data bus 804 may be the same data bus.

In accordance with an embodiment of the invention, UMUX 860 may include one or more address ports 868 and a set of switching transistors 864, the switching transistors adapted to connect an external voltage source Vsr 866 to an array segment, for example, one or more sectors 853A. Optionally, the array segment may comprise a global source bit line (GSBL) 865. Switching transistors 864 are further adapted to carry an operating current into memory array 853, and into sector 853A, in accordance with an addressing signal applied to the address ports 868.

In accordance with an embodiment of the invention, UMUX 870 may include one or more address ports 878 and a set of switching transistors 874, the switching transistors adapted to connect an external voltage drain Vdr 876 to the array segments, for example, one or more sectors 853A. Optionally, the array segment may comprise a global drain bit line (GDBL) 875. Switching transistors 874 are further adapted to carry the operating current out of sector 853A, and out of memory array 853, in accordance with an addressing signal applied to the address ports 878.

Operating current leaving memory array 853 may be connected to Vdr 876, which may comprise for example one or more sense amplifiers 851. Optionally, Vdr may comprise a drain regulator, or other circuitry adapted to act as Vdr as may be known by a person skilled in the art. The operating current may comprise, in some embodiments of the invention, a sensing current, a programming current, a test current, or any other type of current according to the circuitry adapted to act as Vdr.

Memory array 853 comprises a plurality of sectors 853A, each sector including memory cells 862 arranged in n+1 rows 853" and m columns 853', the cells in a column interconnected such that a source electrode in each cell is connected to a local source bit line (LSBL) 863, for example BL1, BL3, BL 5 . . . BLm−1; the drain electrode of each cell is connected to a local drain bit line (LDBL) 873, for example, BL2, BL4, BL6 . . . BLm; and a gate electrode is connected to a word line 867, for example, WL1, WL2, WL3 . . . WLn+1. Memory cells 862 may comprise Floating Gate (FG) flash memory, SONOS (Silicon Oxide Nitride Oxide Semiconductor), TANOS (Tantalum Nitride Oxide Semiconductor), NROM (Nitride Read Only Memory), or other type of memory cells used in NVM.

One or more LSBL 863, for example BL1+BL3, may be connected to GSBL 865, the GSBL adapted to carry operating current from UMUX 860 to the one or more LSBL, responsive to UMUX 860 switching. Optionally, 3, 4, 5, 6, 7, 8, 9, or 10 or more LSBL 863, may be connected to GSBL 865. One or more LDBL 873, for example BL2+BL4, may be connected to GDBL 875, the GDBL adapted to carry operating current from the one or more LDBL to UMUX 870. Optionally, 2, 3, 4, 5, 6, 7, 8, 9, or 10 or more LDBL 873, may be connected to GDBL 875. UMUX 870, responsive to substantially simultaneously receiving addressing signals (synchronization) with UMUX 860, may connect GDBL 875 to Vdr 876.

A first select switch 861, which may comprise one or more transistors, may optionally be placed at a junction 861' of LSBL 863 and GSBL 865, and/or a second select switch 871 may be placed at a junction 871' of LDBL 873 and GDBL 875. Select switch 861, responsive to a control signal received from UMUX 860, is adapted to select between a plurality of LSBL 863 connected to GSBL 865. Select switch 871, responsive to a control signal received from UMUX 870, is adapted to select between a plurality of LDBL 873 connected to GDBL 875.

In some embodiments of the invention, NVM 800 may be configured such that the UMUX 860 is connected to the external voltage drain Vdr, and UMUX 870 is connected to the external voltage source Vsr. In this optional configuration, the source electrode and the drain electrodes in memory cells 862 are interchanged; that is, LSBL 863 is connected to the drain electrode of the cells in column 853 and LDBL 873 is connected to the source electrode of the cells in the column. Optionally, LDBL 873 is connected to GSBL 865 and LSBL 863 is connected to GDBL 875.

Figure 8C:
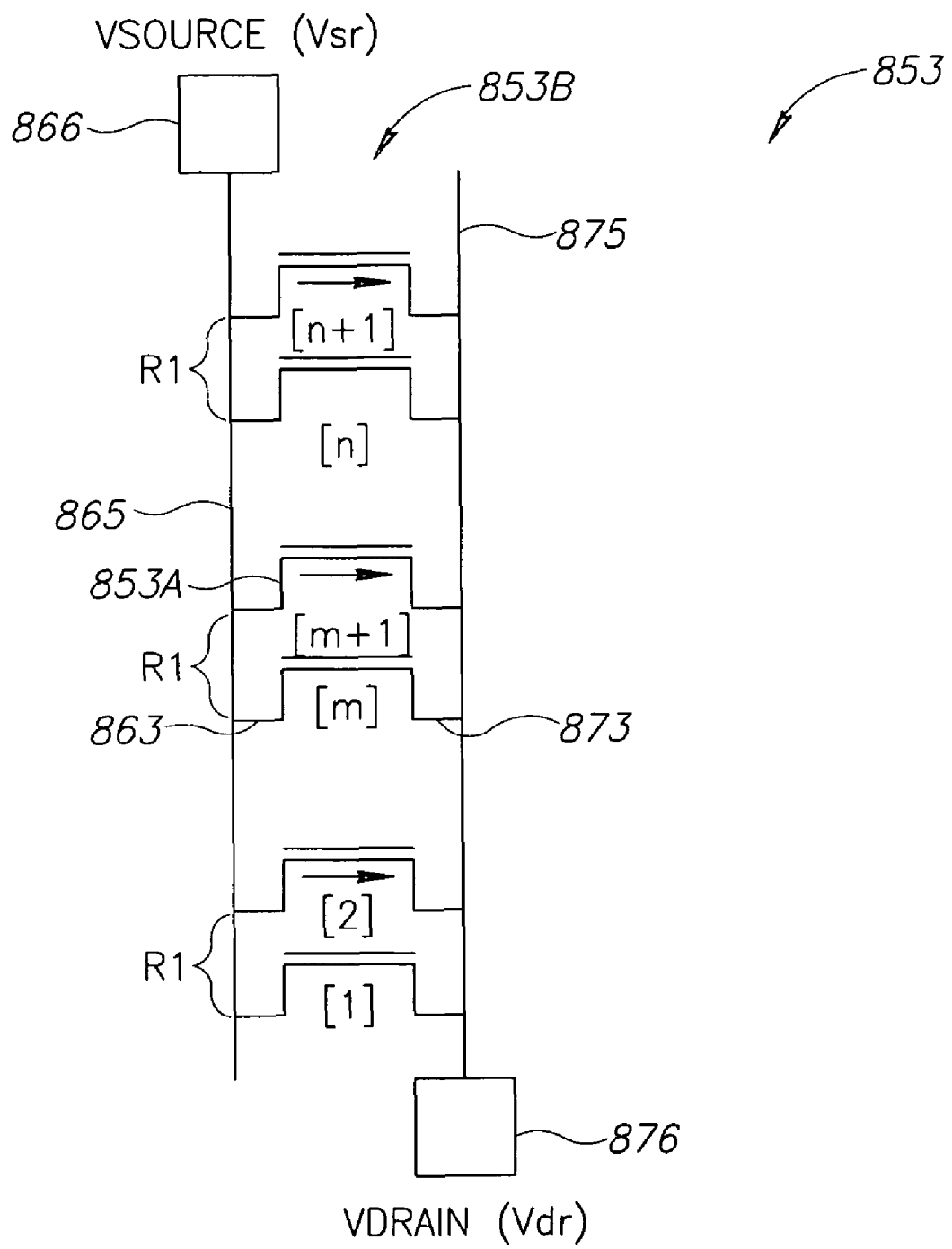
FIG. 8C schematically illustrates an arbitrary sector bank in the memory array of FIG. 8B, in accordance with an embodiment of the invention.

Reference is also made to FIG. 8C which schematically illustrates an exemplary sector bank 853B in memory array 853 including a plurality of n+1 sector 853A, in accordance with an embodiment of the invention. UMUX 860 is placed on one side of memory array 853 and UMUX 870 is placed on an opposing side of the memory array.

In accordance with an embodiment of the invention, a position of UMUX 860 and of UMUX 870 with respect to array 853 is such that the summation of a portion of a length of GSBL 865 and LSBL 863 extending from UMUX 860 to an arbitrary memory cell 862 in sector 853A, and of a portion of a length of GDBL 875 and LDBL 873 extending from the same arbitrary cell to UMUX 870, is substantially the same for all cells in sector bank 853B (regardless of whether or not the cells are in the same sector or in different sectors). For example, the summation of the length of a portion of GSBL 865 and LSBL 863 extending from UMUX 860 to a cell 862 located at WL3-BL7 in sector [m+1] and of a portion of GDBL 875 and LDBL 873 extending from the cell in sector [m+1] to UMUX 870, is equal to the summation of the length of a portion of GSBL 865 and LSBL 863 extending from UMUX 860 to a cell located at WL3-BL7 in sector [2] and of a portion of GDBL 875 and LDBL 873 extending from the cell in sector [2] to UMUX 870.

In accordance with an embodiment of the invention, by maintaining a same bit line length from UMUX 860 to UMUX 870 for all cells 862 in sector bank 853B, IR drops due to bit line resistance are essentially the same for all cells 862 and an essentially equal drain to source voltage Vds may be maintained across all cells in array 853. In some embodiments of the invention, LSBL 863 and LDBL 873 may extend from UMUX 860 to cells 862 and from cells 862 to UMUX 870, respectively. An example of a position of UMUX 860 and UMUX 870 may be at opposing ends of GSBL 865 and GDBL 875, respectively; for example at opposite ends of array 853 (such as top and bottom, or left and right sides).

Vds at each memory cell 862 in sector 853A may be expressed by the following equation:

$$Vds(m)=Vdr-Vsr-i(n*R1)$$

where

Vds(m) is Vds at a memory cell in sector [m] in sector bank 853B;

Vdr is voltage of drain regulator Vdr 876;

Vsr is voltage of source regulator Vsr 866;

i is the current flowing between source and drain in the memory cells in sector [m] 853A;

n+1 is the number of sectors 853A in sector bank 853B;

m is the position of any sector 853A in sector bank 853B; and

R1 is the bit line resistance of GSBL 765 and GDBL 775 between successive sector 853A in sector bank 853B, for example, sector [n] and sector [n+1].

Figure 9A:
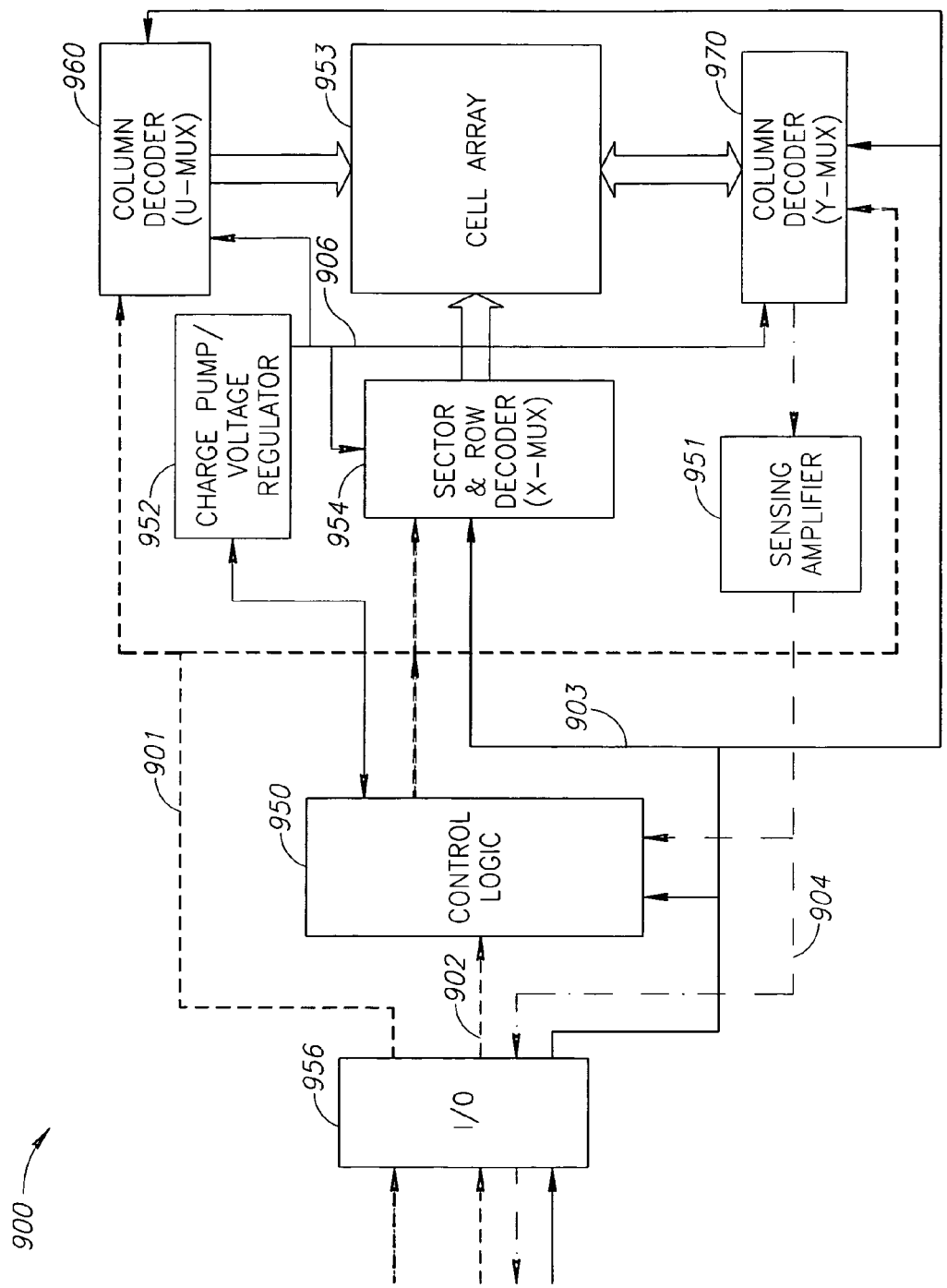
FIG. 9A, schematically illustrates a functional block diagram of an exemplary non-volatile memory (NVM), in accordance with an embodiment of the invention.
Figure 9B:
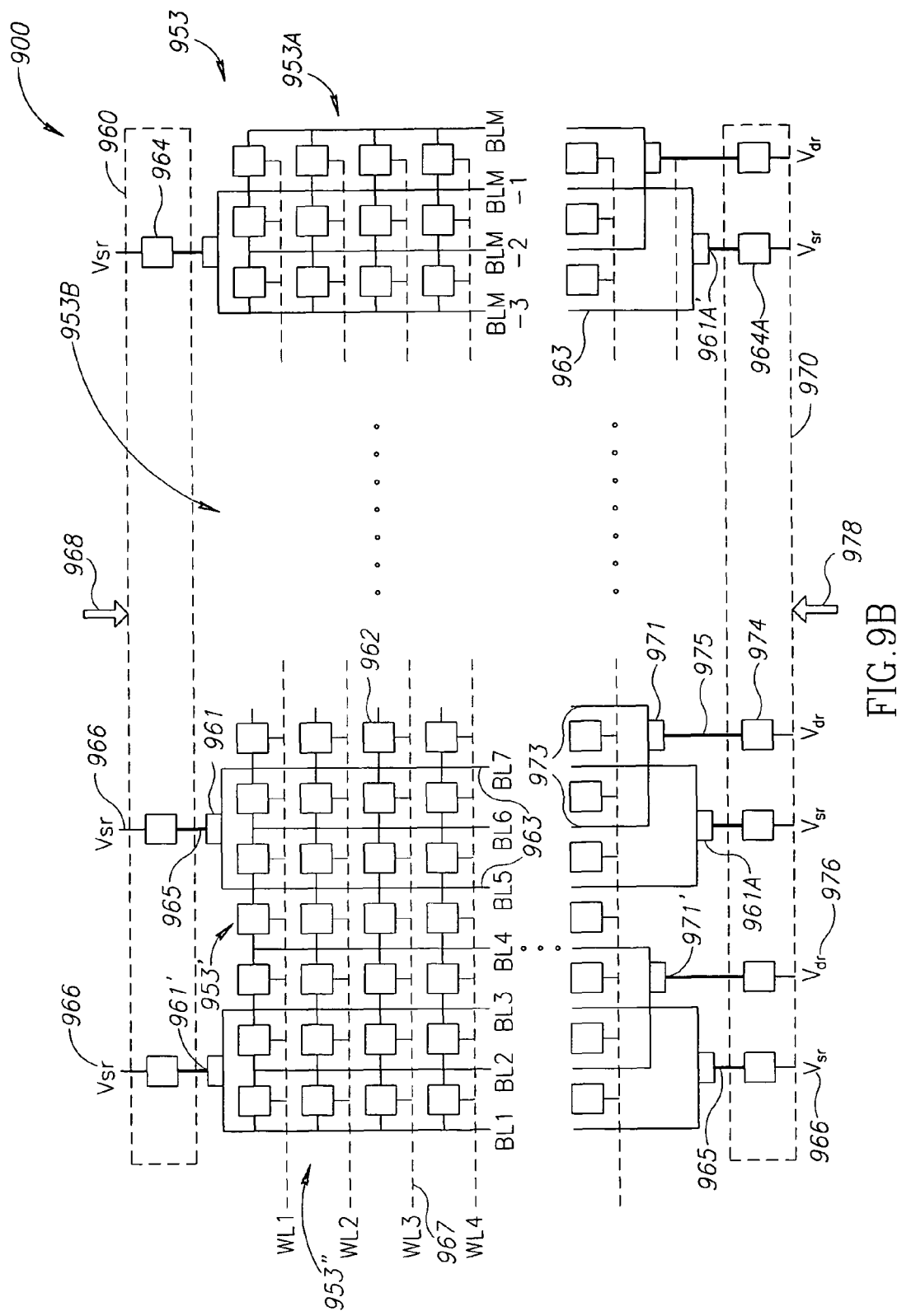
FIG. 9B schematically illustrates a sector in a memory cell array, a UMUX, and a Y-MUX, all comprised in the NVM of FIG. 9A, in accordance with an embodiment of the invention.

Reference is made to FIG. 9A, which schematically illustrates a functional block diagram of an exemplary non-volatile memory 900 (NVM); and to FIG. 9B which schematically illustrates a sector 953A in an NVM array 953, a UMUX 960, and a Y-MUX 970, all comprised in NVM 900; both in accordance with an embodiment of the invention. NVM 900 additionally comprises a primary control circuit (control logic) 950, a sense amplifier 951, a charge pump/voltage regulator 952, a sector/row decoder (X-MUX) 954, and an input/output interface module 956. In some embodiments of the invention, Y-MUX 970 may be the same as that shown in FIG. 6 at 655. Primary control circuit 950, charge pump/voltage regulator 952, sense amplifier 951, memory cell array 953, X-MUX 954, UMUX 960, and input/output interface module 956 may be the same as that shown in FIG. 8A at 850, 851, 852, 853, 854, 860, and 856. Optionally, sense amplifier 951 may be replaced, or may be in addition to, a drain regulator and or other circuitry adapted to be connected to UMUX 960 and/or Y-MUX 970, as may be known to a person skilled in the art. Additionally, address bus 901, control lines 902, input data bus 903, and output data bus 904, may be the same as that shown in FIG. 8A at 801, 802, 803, and 804. Optionally, input data bus 903 and output data bus 904 may be the same data bus.

In accordance with an embodiment of the invention, UMUX 960 may include one or more address ports 968 and a set of switching transistors 964, the switching transistors adapted to connect an external voltage source Vsr 966 to an array segment, for example, one or more sectors 953A. Optionally, the array segment may comprise a first global source bit line (GSBL) 965. Switching transistors 964 are further adapted to carry a first operating current into memory array 953, and into sector 953A, in accordance with an addressing signal applied to the address ports 968.

In accordance with an embodiment of the invention, Y-MUX 970 may include one or more address ports 978 and a set of switching transistors 974, the switching transistors adapted to connect an external voltage drain Vdr 976 to the array segments, for example, one or more sectors 953A. Optionally, the array segment may comprise a global drain bit line (GDBL) 975. Switching transistors 974 are further adapted to carry first operating current out of sector 953A, and out of memory array 953, in accordance with an addressing signal applied to the address ports 978.

In accordance with an embodiment of the invention, Y-MUX 970 may additionally include a set of switching transistors 964A, the switching transistors adapted to connect the external voltage source Vsr 966 to the array segment, for example, the one or more sectors 953A. Optionally, the array segment may comprise a second global source bit line (GSBL) 965A. Switching transistors 964A are further adapted to carry a second operating current into memory array 953, and into sectors 953A, in accordance with the addressing signal applied to the address ports 978.

Operating current leaving memory array 953, and which may comprise first and second operating currents, may be connected to Vdr 976, which may comprise for example one or more sense amplifiers 951. Optionally, Vdr may comprise a drain regulator, or other circuitry adapted to act as Vdr as may be known by a person skilled in the art. The operating current may comprise, in some embodiments of the invention, a sensing current, a programming current, a test current, or any other type of current according to the circuitry adapted to act as Vdr.

Memory array 953 comprises a plurality of sectors 953A, each sector including memory cells 962 arranged in n+1 rows 953'' and m columns 953', the cells in a column interconnected such that a source electrode in each cell is connected to a local source bit line (LSBL) 963, for example BL1, BL3, BL5 . . . BLm−1; the drain electrode of each cell is connected to a local drain bit line (LDBL) 973, for example, BL2, BL4, BL6 . . . BLm; and a gate electrode is connected to a word line 967, for example, WL1, WL2, WL3 . . . WLn+1. Memory cells 962 may comprise Floating Gate (FG) flash memory, SONOS (Silicon Oxide Nitride Oxide Semiconductor), TANOS (Tantalum Nitride Oxide Semiconductor), NROM (Nitride Read Only Memory), or other type of memory cells used in NVM.

One or more LSBL 963, for example BL1+BL3, may be connected to GSBL 965, the GSBL adapted to carry operating current from the UMUX 960 and Y-MUX 970 to the one or more LSBL, responsive to UMUX 960 and Y-MUX 970 switching. Optionally, 3, 4, 5, 6, 7, 8, 9, or 10 or more LSBL 963, may be connected to GSBL 965. Optionally, one or more LSBL 963 may be connected to a second GSBL adapted to carry operating current from Y-MUX 970 to the one or more LSBL. One or more LDBL 973, for example BL2+BL4, may be connected to GDBL 975, the GDBL adapted to carry operating current from the one or more LDBL to Y-MUX 970. Optionally, 2, 3, 4, 5, 6, 7, 8, 9, or 10 or more LDBL 973, may be connected to GDBL 975. Y-MUX 970, responsive to substantially simultaneously receiving addressing signals (synchronization) with UMUX 960, may connect GSBL 965 to Vsr 966, and GDBL 975 to Vdr 976.

A first select switch 961, which may comprise one or more transistors, may optionally be placed at a junction 961' of LSBL 963 and GSBL 965; a second select switch 961A may be placed at a junction 971A' of LSBL 973 and GSBL 965; and a third select switch 971 may be placed at a junction 971' of LDBL 973 and GDBL 975. Select switch 961, responsive to a control signal received from UMUX 960, and select switch, responsive to a control signal received from Y-MUX 970, are adapted to select between a plurality of LSBL 963 connected to GSBL 965, respectively. Select switch 971, responsive to a control signal received from Y-MUX 970, is adapted to select between a plurality of LDBL 973 connected to GDBL 975.

Figure 9C:
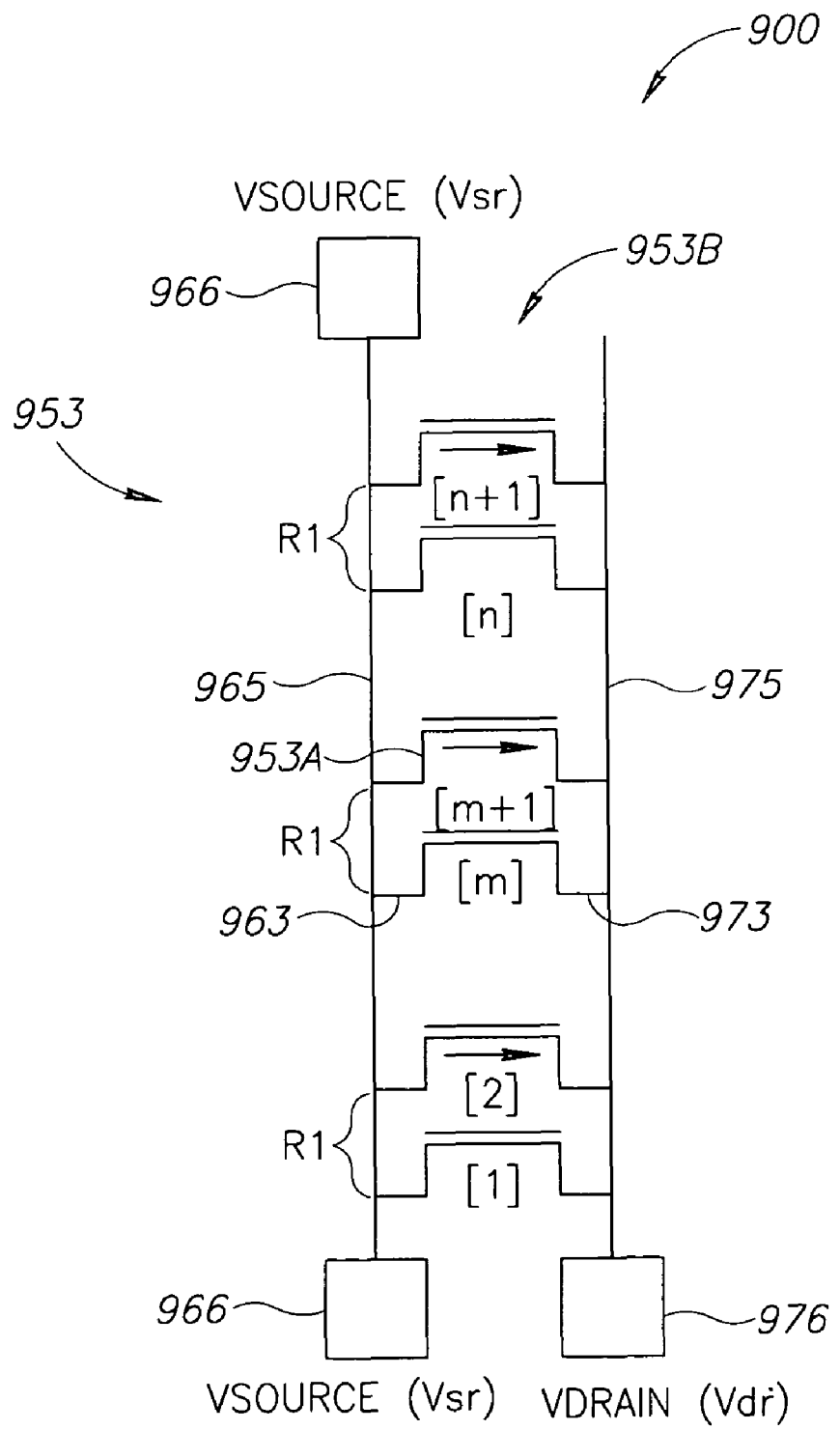
FIG. 9C schematically illustrates an arbitrary sector bank in the memory array of FIG. 9B, in accordance with an embodiment of the invention.

Reference is also made to FIG. 9C which schematically illustrates an exemplary sector bank 953B in memory array 953, including a plurality of n+1 sector 953A, in accordance with an embodiment of the invention. UMUX 960 is placed on one side of memory array 953 and Y-MUX 970 is placed on an opposing side of the memory array.

In accordance with an embodiment of the invention, a position of UMUX 960 and of Y-MUX 970 with respect to array 953 is such that midway along GSBL 965, bit line resistance when viewed in each direction towards voltage source 966 is one half of a total length bit line resistance (when viewed towards UMUX 960 and Y-MUX 970, the bit line resistance may be represented by two equal-valued resistors of one half the resistance of the total length bit line, connected in parallel). This results in a reduction in the bit line resistance of GSBL 965 by a factor of 4 and therefore reduced IR drops in GSBL 965 compared to the basic, known in the art, configuration shown in FIG. 7. Optionally, more voltage sources Vsr 966 may be connected to GSBL 965 such that the bit line resistance when viewed from midway along the GSBL towards the voltage sources is the same in all directions; bit line resistance may be reduced by a factor of $x^2$ where $x^2$ is the number of connecting directions. For example, UMUX 960 and Y-MUX 970 may be positioned at opposing ends of GSBL 965, on opposing sides of memory array 953 (such as top and bottom, or right side and left side).

In accordance with an embodiment of the invention, substantially reduced variations in Vds between cells 962 in array 953 may be achieved, the variations caused by IR drops along GDBL 975 depending on the location of cell 962 and sector 953A in sector bank 953B. The variations in Vds may be compensated for by adjusting Vdr 976 based on a location of sector 953A in array 953. Vds at each memory cell 962 in sector 953A may be expressed by the following equation:

$$Vds[m] = Vd[m] - Vs[m] = Vdr - i*R1(m-1) - Vsr - i*R1*[(m-1)(n+1-m)]/n$$

where

Vds(m) is Vds at a memory cell in sector [m] 953A in sector bank 953B;

Vdr is voltage of drain regulator Vdr 976;

Vsr is voltage of source regulator Vsr 966;

i is the current flowing between source and drain in the memory cells in sector [m] 953A;

n+1 is the number of sectors 953A in sector bank 953B;

m is the position of any sector 953A in sector bank 953B; and

R1 is the bit line resistance of GSBL 965 and GDBL 975 between successive sector 953A in sector bank 953B, for example, sector [n] and sector [n+1].

In accordance with an embodiment of the invention, reduction of bit line resistance in GSBL 965 causes a smaller source voltage to develop at the source electrode of memory cell 962 in sector 953A, substantially improving read and program operations in the cell. Vs at each memory cell 962 in sector 953A may be expressed by the following equation:

$$Vs[m]=Vsr+i*R1*[(m-1)(n+1-m)]/n$$

where,

Vs(m) is voltage at source electrode at a memory cell in sector [m] 953A in sector bank 953B;

Vdr is voltage of drain regulator Vdr 976;

Vsr is voltage of source regulator Vsr 966;

i is the current flowing between source and drain in the memory cells in sector [m] 953A;

n+1 is the number of sectors 953A in sector bank 953B;

m is the position of any memory cell 962 in sector bank 953B; and

R1 is the bit line resistance of GSBL 965 between successive sectors 953A in sector bank 953B, for example, sector [n] and sector [n+1].

A worst case Vs, Vs(max) may be calculated at the midpoint of GSBL 965 where m=(n+i)/2 for 'n' an odd number or m=(n+2)/2 for 'n' an even number and is given by:

for n an even number, $$Vs[(n+2)/2]=Vsr+i*R1*(n)/4;$$

and for n an odd number $$Vs[(n+i)/2]=Vsr+i*R1*[(n-1)(n+1)/4]$$

Figure 10A:
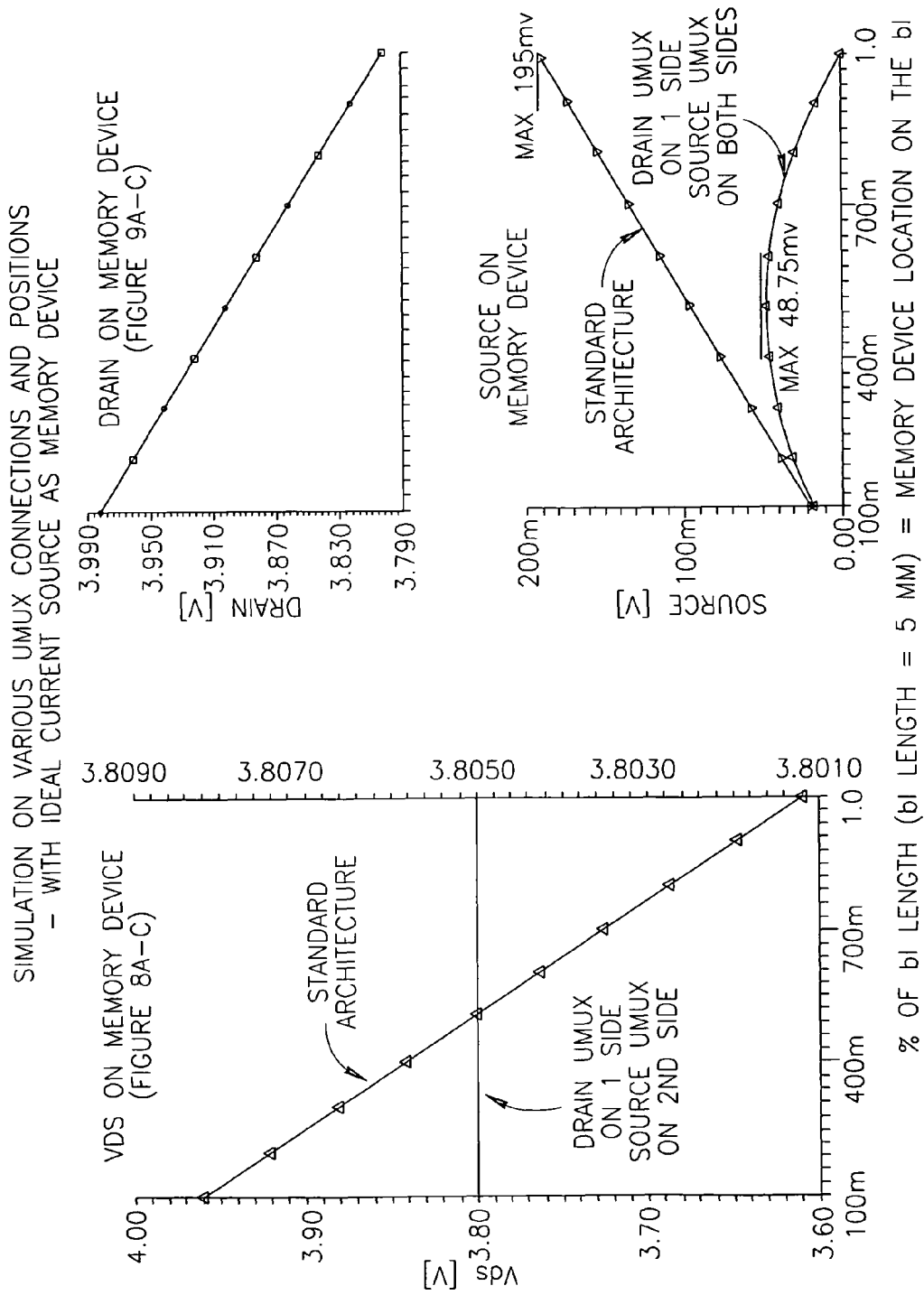
Figure 10B:
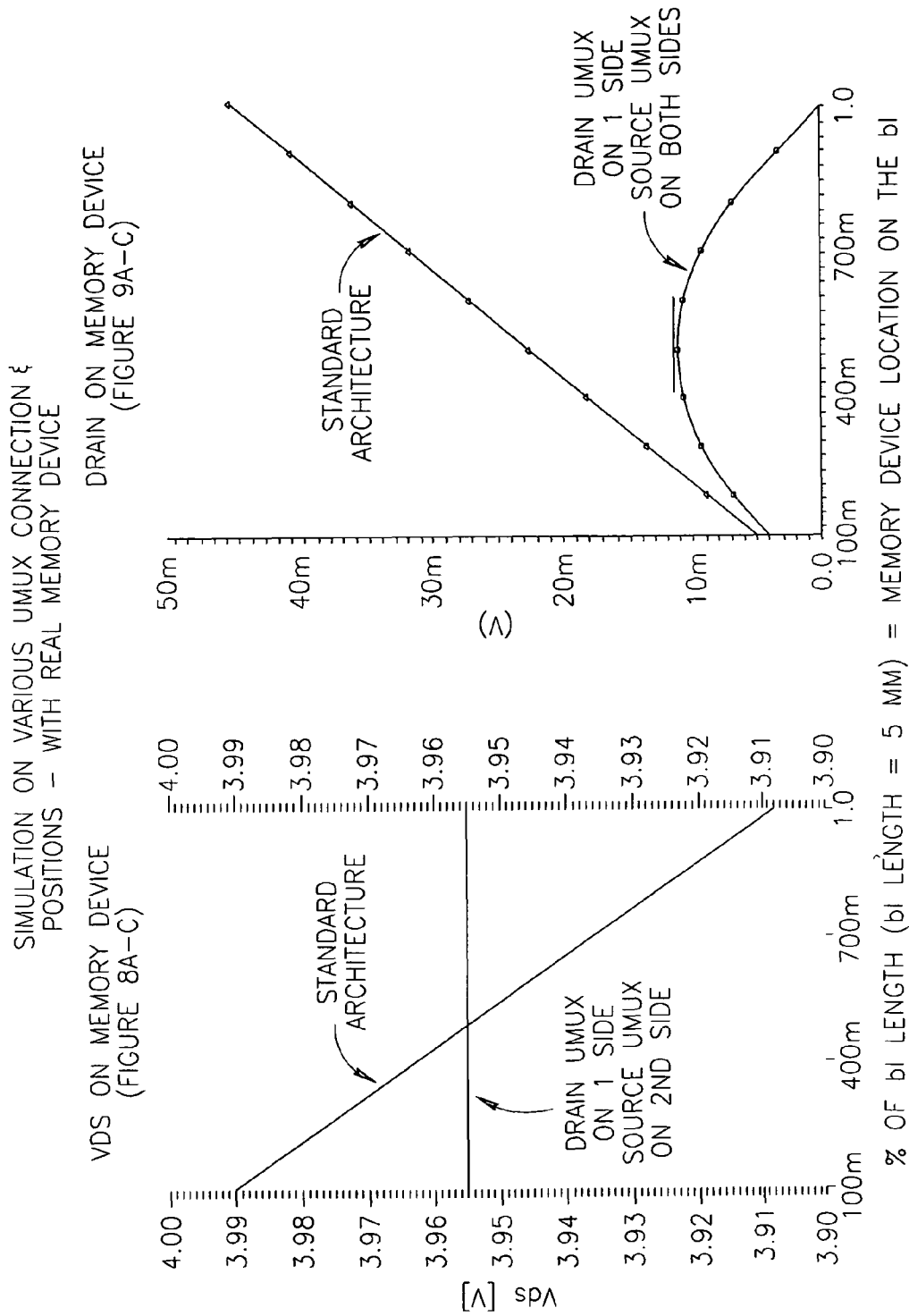

Reference is made to FIGS. 10A, 10B and 10C which provide graphic and tabular results of simulations performed on an ideal current source representing an NVM, and simulations performed on a real model NVM, all in accordance with an embodiment of the invention. The simulations where performed on circuit configurations shown in FIGS. 8A-8C, 9A-9C, and FIG. 7 (known in the art).

The results of the simulation performed on the configuration shown in FIGS. 8A-8C are indicated in the graphs of FIGS. 10A and 10B as "Drain Umux on 1 side Source Umux on $2^{nd}$ side"; for the configuration shown in FIGS. 9A-9C the results are indicated as "Drain Umux on 1 side Source Umux on both sides"; and for the configuration shown in FIG. 7 the results are indicated as "Standard architecture". FIG. 10C displays in tabular form the results of the graphs shown in FIGS. 10A and 10B. The circuit configurations simulated, and the type of simulation (ideal NVM or real NVM), is indicated in the header of each table, marked 1, 2, 3 and 4. In accordance with an embodiment of the invention, the results show an essentially constant Vds for the circuit configuration shown in FIGS. 8A-8C where UMUX 860 and UMUX 870 are positioned on opposite sides of memory array 853, on opposite ends of GSBL 865 and GDBL 875 (for example, one UMUX on top side of the array and the other on the bottom, or optionally, one UMUX on the right side of the array and the other on the left side). Additionally, the results show that for the circuit configuration shown in FIGS. 9A-9C, where UMUX 960 is placed at one end of GSBL 965 in memory array 953, and Y-MUX 970 is placed at the other end of GSBL 965 (Vsr 966 is applied to both ends of the GSBL), maximum IR drop is at 50% of the length of GSBL 965. Furthermore, the results show that at a half way point along GSBL 965, a maximum (worst case) voltage Vs(max)=48.75 mV (11.34 mV for real memory device) develops at the source electrode of the memory cells in sector 953A connected to the midpoint of the GSBL. This being a substantial improvement over the configuration shown in FIG. 7, where the voltage which develops at the source electrode of the memory cells in sector 753A located at the midpoint of GSBL 765 is 97.5 mV (22.77 mV for real device). Furthermore, in the configuration shown in FIG. 7, Vs(max) occurs at the memory cells in sector 753A furthest located from Vsrr 766, and is estimated to be 195 mV (45.85 mV for real device).

Figure 11:
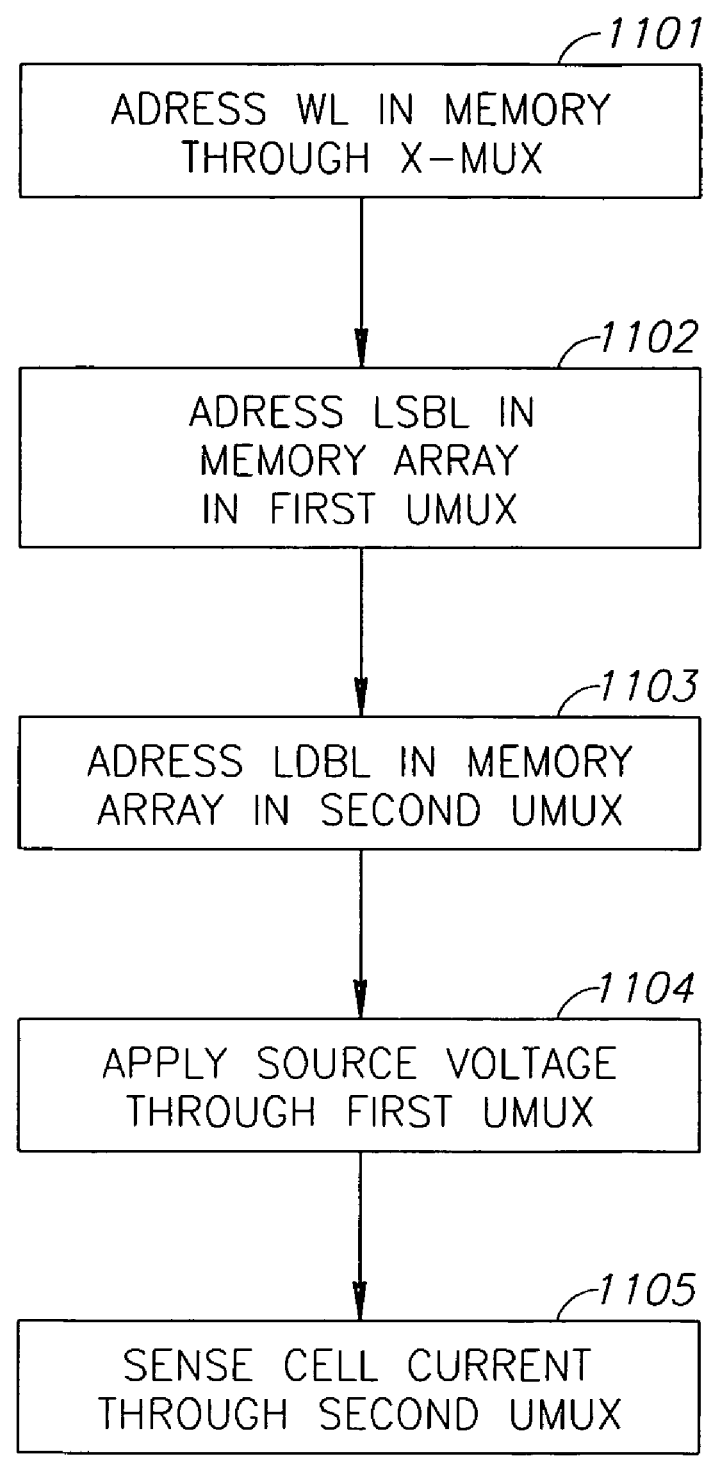
FIG. 11 schematically illustrates an exemplary flow chart of a typical read operation in the NVM shown in FIGS. 8A-8C, in accordance with an embodiment of the invention.

Reference is made to FIG. 11 which schematically illustrates an exemplary flow chart of a typical read operation in NVM 800 shown in FIGS. 8A-8C, in accordance with an embodiment of the invention.

[STEP 1101] Responsive to a read command receieved from a host processor externally located to NVM 800, control logic 850 sends an address call to X-MUX 854 specifying a sector 853A, and a write line WL 867 in memory array 853, for example WL4. Control logic 850 also sends a command to charge pump/voltage regulator 852 to produce a gate bias voltage.

[STEP 1102] Control logic 850 sends an address call to UMUX 860 through address ports 868 specifying an LSBL 863 in memory array 853, for example BL5. Optionally GLSB 865 is specified. UMUX 860 receives the address call and responsively, activates switching transistor 864 associated with the respective LSBL. Optionally, UMUX 860 activates select switch 861.

[STEP 1103] Control logic 850 sends an address call to UMUX 870 through address ports 878 specifying an LDBL 873 in memory array 853, for example BL6. Optionally GLDB 875 is specified. UMUX 870 receives the address call and responsively, activates switching transistor 874 associated with the respective LSBL. Optionally, UMUX 870 activates select switch 871.

[STEP 1104] Control logic 850 sends a command to charge pump/voltage regulator 852 to produce a source voltage connecting to UMUX 860. Charge pump/voltage regulator 852 produces a source voltage which is applied through UMUX 860 to LSBL 863, for example, to BL 5.

[STEP 1105] A sense current is generated at cell 862 in memory array 853 located at the intersection of activated WL 867 and activated LSBL 863, for example at the cell located at WL4-BL5. The sense current flows through LDBL 873 through UMUX 870 to sense amplifier 851, for example through BL6.

Figure 12:
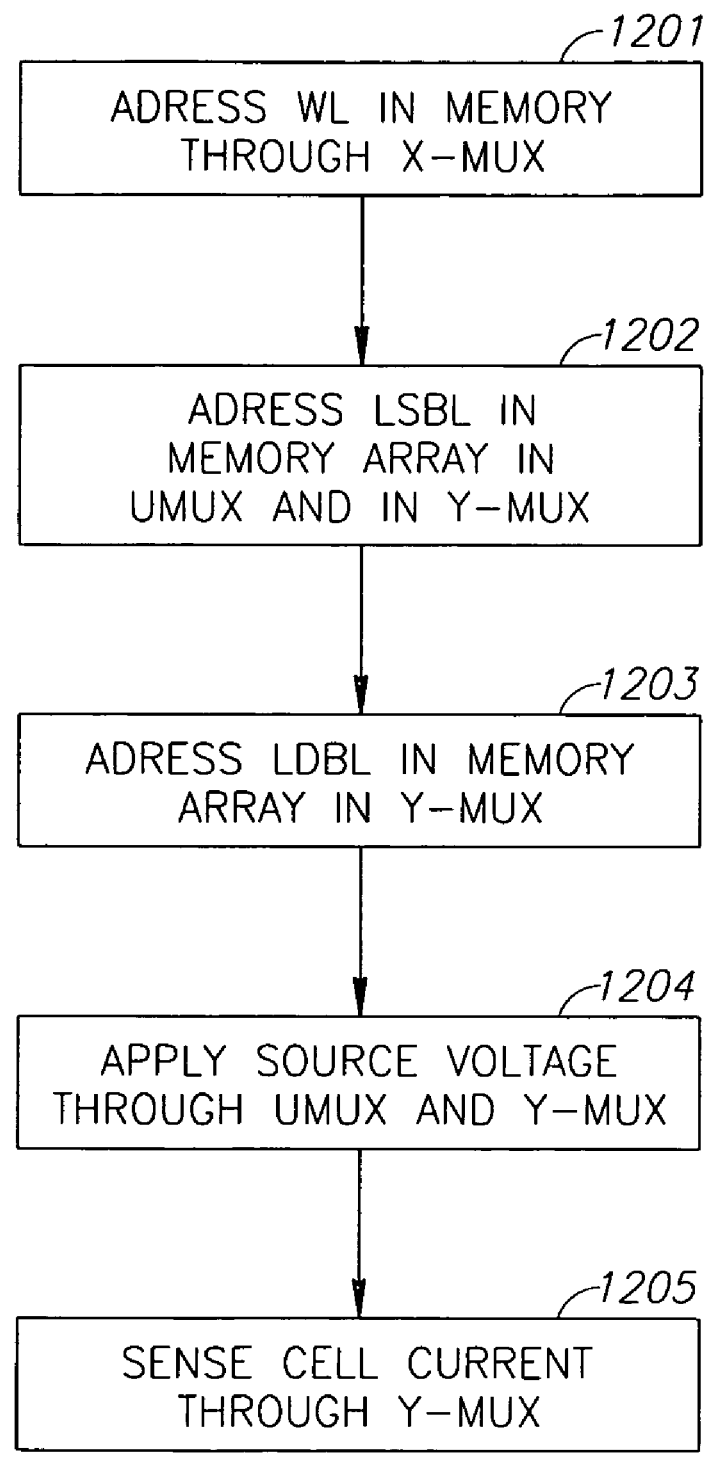
FIG. 12 schematically illustrates an exemplary flow chart of a typical read operation in the NVM shown in FIGS. 9A-9C, in accordance with an embodiment of the invention.

Reference is made to FIG. 12 which schematically illustrates an exemplary flow chart of a typical read operation in NVM 900 shown in FIGS. 9A-9C, in accordance with an embodiment of the invention.

[STEP 1201] Responsive to a read command receieved from a host processor externally located to NVM 900, control logic 950 sends an address call to X-MUX 954 specifying a sector 953A, and a write line WL 967 in memory array 953, for example WL4. Control logic 950 also sends a command to charge pump/voltage regulator 952 to produce a gate bias voltage.

[STEP 1202] Control logic 950 sends an address call to UMUX 960 through address ports 968 specifying an LSBL 963 in memory array 953, for example BL5. Optionally GLSB 965 is specified. UMUX 960 receives the address call and responsively, activates switching transistor 964 associated with the respective LSBL. Optionally, UMUX 860 activates select switch 961. Control logic 950 additionally sends an address call to Y-MUX 970 through address ports 978 specifying an LSBL 963 in memory array 953, for example BL5. Optionally GLSB 965A is specified. Y-MUX 970 receives the address call and responsively, activates switching transistor 964A associated with the respective LSBL. Optionally, UMUX 970 activates select switch 961A.

[STEP 1203] Control logic 950 sends an address call to Y-MUX 970 through address ports 978 specifying an LDBL 973 in memory array 953, for example BL6. Optionally GLDB 975 is specified. Y-MUX 970 receives the address call and responsively, activates switching transistor 974 associated with the respective LSBL. Optionally, Y-MUX 970 activates select switch 971.

[STEP 1204] Control logic 950 sends a command to charge pump/voltage regulator 952 to produce a source voltage connecting to UMUX 860, and to Y-MUX 970. Charge pump/voltage regulator 952 produces a source voltage which is applied through UMUX 960 to LSBL 963, for example, to BL 5.

[STEP 1205] A sense current is generated at cell 962 in memory array 953 located at the intersection of activated WL 967 and activated LSBL 963, for example at the cell located at WL4-BL5. The sense current flows through LDBL 973 through UMUX 870 to sense amplifier 851, for example through BL6.

Figure 13:
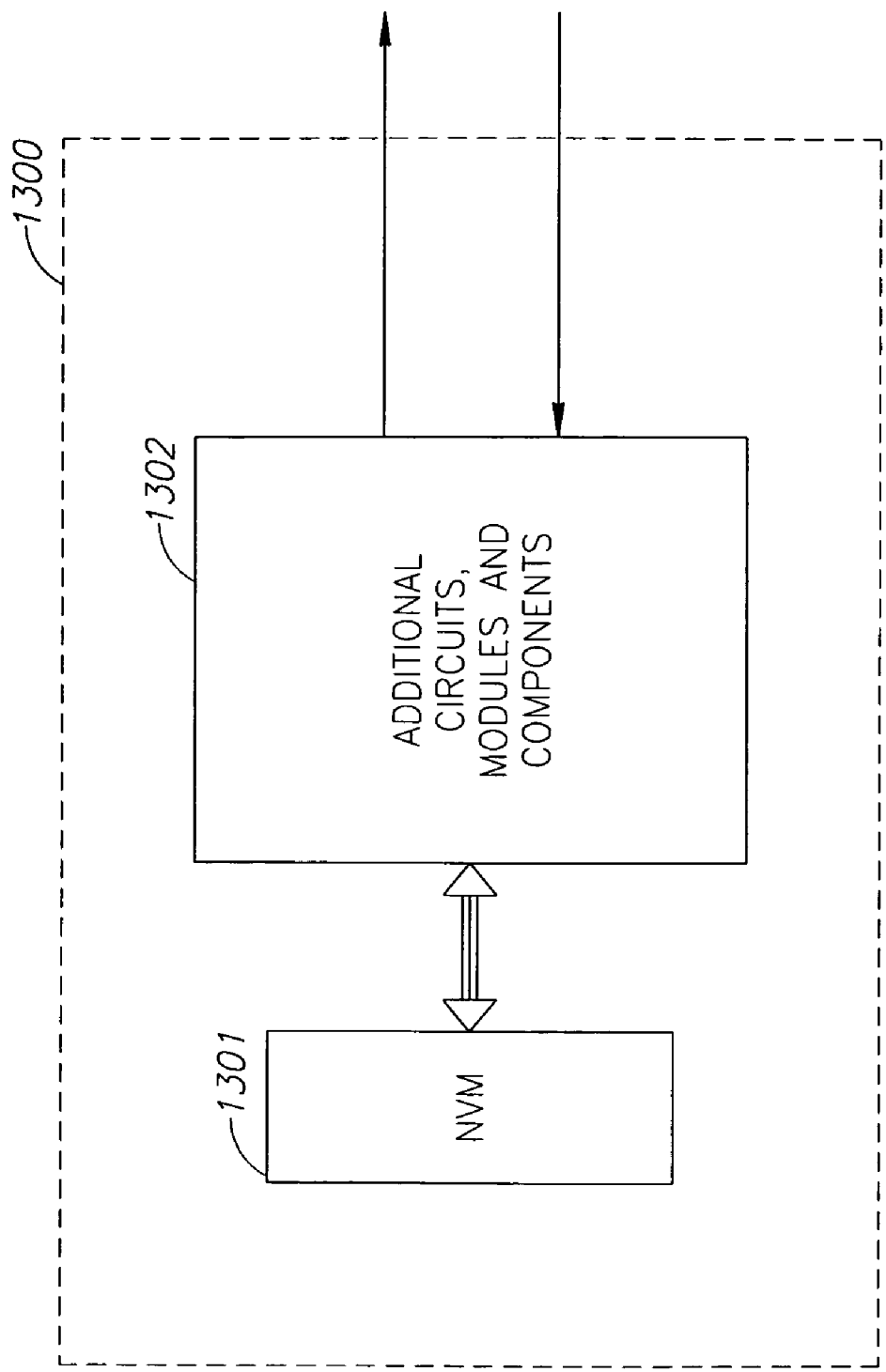
FIG. 13 schematically illustrates a functional block diagram of an exemplary apparatus comprising an NVM, in accordance with an embodiment of the invention.

Reference is made to FIG. 13 which schematically illustrates a functional block diagram of an exemplary apparatus 1300 comprising an NVM 1301, in accordance with an embodiment of the invention. Apparatus 1300 may optionally comprise a plurality of NVMs 1300. NVM 1301 may be the same or substantially similar to NVM 800 shown in FIGS. 8A-8C. Optionally, NVM 1301 may be the same or substantially similar to NVM 900 shown in FIGS. 9A-9C. Apparatus 1300 additionally comprises circuits/modules/components 1302, the circuits, modules, and components, adapted to perform functions associated with the application of apparatus 1300. For example, in some embodiments of the invention, apparatus 1300 may be used in, or included in, communication systems, medical systems, transportation systems, computer systems, consumer electronic systems, power transmission systems, and/or other systems comprising the use of ICs. Examples of apparatus 1300 may include, for example, desktop computers and workstation, portable computers, mobile telephones, avionics, and medical imaging equipment.

Apparatus 1300 may include or may be part of a computing system including a processor, a memory, a storage unit, an input unit, an output unit, a communication unit, and/or any other suitable component. Apparatus 1300 may be, for example, a multi-core processor (CMP), a multiprocessor, a central processing unit (CPU), a digital signal processor (DSP), a microprocessor, a host processor, a controller, a plurality of processors or controllers, a chip, a microchip, circuitry, a logic unit, an integrated circuit (IC), an application-specific IC (ASIC), or any other suitable multi-purpose or specific processor or controller. Apparatus 1300 may include, for example, a random access memory (RAM), a dynamic RAM (DRAM), a synchronous DRAM (SD-RAM), a non-volatile memory, a volatile memory, or other suitable memory unit.

Apparatus 1300 may include, for example, a hard disk drive, a floppy disk drive, a compact disk (CD) drive, a CD-ROM drive, a digital versatile disk (DVD) drive, or other suitable removable or non-removable storage units. Apparatus 1300 may include, for example, a keyboard, a keypad, a mouse, a touch-pad, a stylus, a microphone, or other suitable pointing device or input device. Apparatus 1300 may include, for example, a cathode ray tube (CRT) monitor or display unit, a liquid crystal display (LCD) monitor or display unit, a screen, a monitor, a speaker, or other suitable display unit or output device.

Apparatus 1300 may include, for example, a wired or wireless network interface card (NIC), a wired or wireless modem, a wired or wireless receiver and/or transmitter, a wired or wireless transmitter-receiver and/or transceiver, a radio frequency (RF) communication unit or transceiver, or other units able to transmit and/or receive signals, blocks, frames, transmission streams, packets, messages and/or data. Apparatus 1300 may optionally include, or may optionally be associated with, for example, one or more antennas, for example, a dipole antenna, a monopole antenna, an omni-directional antenna, an end fed antenna, a circularly polarized antenna, a micro-strip antenna, a diversity antenna, or the like.

In some embodiments, apparatus 1300 may include, or may be, a Personal Computer (PC); a desktop computer; a mobile computer; a laptop computer; a notebook computer; a tablet computer; a server computer; a handheld computer; a handheld device; a Personal Digital Assistant (PDA) device; a handheld PDA device; an on-board device; an off-board device; a hybrid device; a vehicular device; a non-vehicular device; a mobile or portable device; a non-mobile or non-portable device; a wireless communication station; a wireless communication device; a wireless Access Point (AP); a wired or wireless router; a wired or wireless modem; a unit or device of a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), a two-way radio communication system, and/or a cellular radio-telephone communication system; a cellular telephone; a wireless telephone; a Personal Communication Systems (PCS) device; a PDA device which incorporates a wireless communication device; a mobile or portable Global Positioning System (GPS) device; a device which incorporates a GPS receiver or transceiver or chip; a device which incorporates an RFID element or chip; a Multiple Input Multiple Output (MIMO) transceiver or device; a Single Input Multiple Output (SIMO) transceiver or device, a Multiple Input Single Output (MISO) transceiver or device; a multi-standard radio device, a wired or wireless handheld device (such as a BlackBerry, Palm Treo, or the like), a Wireless Application Protocol (WAP) device, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A non-volatile memory (NVM) memory device comprising: an array of memory cells; a unidirectional multiplexer (UMUX), the UMUX comprising two or more address line ports adapted to receive addressing signals corresponding with elements in the memory array, and a set of switching transistors adapted to switch a supply voltage in accordance with the addressing signal such that current only flows into the array; and a multiplexer (Y-MUX), the Y-MUX comprising two or more address line ports adapted to receive addressing signals corresponding with the elements in the memory array, a set of switching transistors adapted to switch a supply voltage in accordance with the addressing signal such that current flows into the array, and a set of switching transistors adapted to switch an operating current in accordance with the addressing signal such that current flows out of the array.

2. The NVM device of claim 1 wherein the elements comprise at least one global source bit line (GSBL) adapted to carry the current flowing into the array.

3. The NVM device of claim 2 wherein the GSBL is connected to at least one local source bit line (LSBL).

4. The NVM device of claim 1 further comprising a second UMUX, the second UMUX comprising two or more address line ports adapted to receive addressing signals corresponding with elements in the memory array, and a set of switching transistors adapted to switch an operating current in accordance with the addressing signal such that current flows out of the array.

5. The NVM device of claim 4 wherein the elements comprise at least one global drain bit line (GDBL) adapted to carry the operating current flowing out of the array.

* * * * *